(12) United States Patent
Schulte et al.

(10) Patent No.: US 9,236,571 B2
(45) Date of Patent: *Jan. 12, 2016

(54) POLYMER MATERIALS FOR ORGANIC ELECTROLUMINESCENT DEVICES

(75) Inventors: Niels Schulte, Kelkheim (DE); Aurélie Ludemann, Frankfurt am Main (DE); Junyou Pan, Frankfurt am Main (DE); René P. Scheurich, Groβ-Zimmern (DE); Thomas Eberle, Landau (DE); Arne Buesing, Frankfurt am Main (DE); Philipp Stoessel, Frankfurt am Main (DE)

(73) Assignee: Merck Patent GmbH, Darmstadt (DE)

( * ) Notice: Subject to any disclaimer, the term of this patent is extended or adjusted under 35 U.S.C. 154(b) by 167 days.

This patent is subject to a terminal disclaimer.

(21) Appl. No.: 13/809,728
(22) PCT Filed: Jun. 28, 2011
(86) PCT No.: PCT/EP2011/003166
§ 371 (c)(1), (2), (4) Date: Apr. 9, 2013
(87) PCT Pub. No.: WO2012/007102
PCT Pub. Date: Jan. 19, 2012

(65) Prior Publication Data
US 2013/0187096 A1 Jul. 25, 2013

(30) Foreign Application Priority Data
Jul. 16, 2010 (DE) .......................... 10 2010 027 320

(51) Int. Cl.
*H01L 51/00* (2006.01)
*H01L 51/50* (2006.01)
(52) U.S. Cl.
CPC .......... *H01L 51/0035* (2013.01); *H01L 51/004* (2013.01); *C08J 2300/206* (2013.01); *H01L51/0067* (2013.01); *H01L 51/0085* (2013.01); *H01L 51/5016* (2013.01); *Y02E 10/549* (2013.01)

(58) Field of Classification Search
CPC  H01L 51/0035; H01L 51/0043; H01B 1/128; H01B 3/30; H01B 1/12
USPC ............. 252/500; 568/325; 544/180; 585/25; 564/433; 526/316
See application file for complete search history.

(56) References Cited

U.S. PATENT DOCUMENTS 8,786,181 B2 * 7/2014 Eberle et al. .................. 313/504
2007/0080343 A1 4/2007 Heun et al.

FOREIGN PATENT DOCUMENTS

DE  10349033 A1  5/2005
EP  2177549 A1   4/2010

OTHER PUBLICATIONS

Behl, M. and Zentel, R. (2004), Block Copolymers Build-up of Electron and Hole Transport Materials. Macromol. Chem. Phys., 205: 1633-1643.*

(Continued)

*Primary Examiner* — Peter F Godenschwager
*Assistant Examiner* — Andrew J Oyer
(74) *Attorney, Agent, or Firm* — Drinker Biddle & Reath LLP

(57) ABSTRACT

The present invention relates to polymeric materials which have electron-transporting, hole-transporting and/or emit ¬ ting units in the side chains. The present invention furthermore relates to processes for the preparation of these polymers, to the use of these polymers in electroluminescent devices and to electroluminescent devices comprising these polymers.

22 Claims, 1 Drawing Sheet

(56) References Cited

OTHER PUBLICATIONS

Qui et al. Macromolecules 2005, 38, 6782-6788.*
Yang et al. Macromolecules 2006, 39, 5213-5221.*

Behl, Marc, et al., "Block Copolymers Build-Up of Electron and Hole Transport Materials", Macromol. Chem. Phys., vol. 205, (2004), pp. 1633-1643.
International Search Report for PCT/EP2011/003166 mailed Oct. 7, 2011.

* cited by examiner

POLYMER MATERIALS FOR ORGANIC ELECTROLUMINESCENT DEVICES

CROSS-REFERENCE TO RELATED APPLICATIONS

This application is a national stage application (under 35 U.S.C. §371) of PCT/EP2011/003166, filed Jun. 28, 2011, which claims benefit of German application 10 2010 027 320.1, filed Jul. 16, 2010 which are both incorporated by reference.

This Patent is subject to a Joint Research and Development Agreement under 35 U.S.C. §103(c)(2)(c). The names of the Parties to the Joint Research and Development Agreement are as follows:
 a. DELO Industrie Kiebstoffe GmbH & Co. KGaA, Windach, Germany;
 b. HC Starck Clevios GmbH, Goslar, Germany;
 c. Merck KGaA, Darmstadt, Germany;
 d. Ormecon GmbH, Ammersbeck, Germany;
 e. Fraunhofer-Gesellschaft zur Förderung der angewandten Forschung e.V., Munchen, Germany;
 f. Fraunhofer Institut Angewandte Polymerforschung, Potsdam-Golm, Germany;
 g. Humboldt-Universität zu Berlin, Berlin Germany;
 h. Universität Potsdam, Potsdam, Germany;
 i. Universität Regensburg, Regensburg, Germany; and
 j. Universität Tübingen, Tubingen, Germany.

The present invention relates to polymeric materials which have electron-transporting, hole-transporting and/or emitting units in the side chains. The present invention furthermore relates to processes for the preparation of these polymers, to the use of these polymers in electroluminescent devices and to electroluminescent devices comprising these polymers.

The structure of organic electroluminescent devices (OLEDs) in which organic semiconductors are employed as functional materials is described, for example, in U.S. Pat. No. 4,539,507, U.S. Pat. No. 5,151,629, EP 0676461 and WO 98/27136. However, further improvements are still desirable. Thus, there is still a need for improvement, in particular with respect to the lifetime, efficiency and operating voltage of organic electroluminescent devices. It is furthermore necessary for the compounds to have high thermal stability and a high glass-transition temperature.

In particular in the case of matrix materials, improvements in the properties are still desirable, since the properties of the matrix material, in particular, also have a significant influence on the above-mentioned properties of the organic electroluminescent device. In particular, there is a need for improvement in the case of matrix materials which simultaneously result in good efficiency, a long lifetime and a low operating voltage. The properties of the matrix material, in particular, are also frequently limiting for the lifetime, the efficiency and the operating voltage of the organic electroluminescent device.

It would be desirable here to have available matrix materials which result, inter alia, in better electron injection into the emitting layer, since an electron-richer emission layer results in better efficiency. In addition, better injection enables the operating voltage to be reduced. Further improvements in the matrix material are therefore necessary.

Electroluminescent devices which use aluminium tris(8-hydroxyquinoline) ($AlQ_3$) as electron conductor have already been known for some time and were disclosed in U.S. Pat. No. 4,539,507 as long ago as 1993. $AlQ_3$ has since then frequently been used as electron-transport material, but has a number of disadvantages: it cannot be applied by vapour deposition without leaving a residue, since it partially decomposes at the sublimation temperature, which represents a major problem, in particular for production plants. This has the consequence that the vapour-deposition sources have to be repeatedly cleaned or changed. Furthermore, decomposition products of $AlQ_3$ enter the OLED, where they contribute to a shortened lifetime and reduced quantum and power efficiency. In addition, $AlQ_3$ has low electron mobility, which results in higher voltages and thus in lower power efficiency. In order to prevent short circuits in the display, it would be desirable to increase the layer thickness. This is not possible with $AlQ_3$ owing to the low charge-carrier mobility and the resultant increase in voltage. The charge-carrier mobility of other electron conductors (U.S. Pat. No. 4,539,507) is likewise too low in order to build up thicker layers therewith, where the lifetime of the OLED is even worse than in the case of the use of $AlQ_3$. The inherent colour (yellow in the solid) of $AlQ_3$, which can result in colour shifts, in particular in the case of blue OLEDs, due to reabsorption and weak reemission, also proves to be unfavourable. Blue OLEDs can only be produced here with considerable reductions in efficiency and adverse effects on colour location (i.e. change in the CIE colour coordinates).

Thus, there continues to be a demand for matrix materials which result in good efficiencies and at the same time in long lifetimes in organic electroluminescent devices.

SUMMARY OF THE INVENTION

Surprisingly, it has now been found that the matrix materials according to the invention have significant improvements in organic electroluminescent devices compared with known materials from the prior art. With the materials according to the invention, it is possible simultaneously to obtain high efficiencies and long lifetimes, which is not possible with materials in accordance with the prior art. In addition, it has been found that the operating voltages can additionally be significantly reduced, which results in higher power efficiencies.

The present invention thus relates to a polymer which comprises at least one structural unit of the following formula (I) in the side chains,

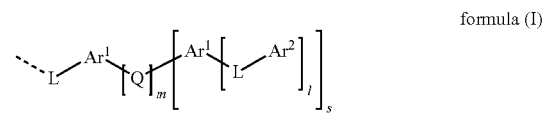

formula (I)

where the dashed line represents the connection to the polymer backbone, and the other symbols and indices used have the following meanings:

L is on each occurrence, identically or differently, a single covalent bond or a straight-chain alkylene group having 1 to 20 C atoms or a branched or cyclic alkylene group having 3 to 20 C atoms, each of which may be substituted by one or more radicals $R^1$, where one or more non-adjacent $CH_2$ groups may be replaced by $R^2C=CR^2$, $C≡C$, $Si(R^2)_2$, $Ge(R^2)_2$, $Sn(R^2)_2$, $C=O$, $C=S$, $C=Se$, $C=NR^2$, $P(=O)(R^2)$, $SO$, $SO_2$, $NR^2$, $O$, $S$ or $CONR^2$ and where one or more H atoms may be replaced by F, Cl, Br, I, CN or $NO_2$;

Ar¹ is on each occurrence, identically or differently, a divalent, mono- or polycyclic, aromatic or heteroaromatic ring system having 5 to 60 aromatic ring atoms, which may be substituted by one or more radicals R¹;

Ar² is on each occurrence, identically or differently, a mono- or polycyclic, aromatic or heteroaromatic ring system having 5 to 60 aromatic ring atoms, which may be substituted by one or more radicals R¹;

Q is a divalent unit, which is either 1,3,5-triazylene or an —X(=O)— group;

m is 1, 2 or 3;

l is 0, 1, 2 or 3;

s is 1 in the case of Q=—X(=O)— and is 1 or 2, preferably 2, in the case Q=1,3,5-triazylene;

R¹ is on each occurrence, identically or differently, D, F, Cl, Br, I, N(Ar³)$_2$, CN, NO$_2$, Si(R²)$_3$, B(OR²)$_2$, C(=O)Ar³, P(=O)(Ar³)$_2$, S(=O)Ar³, S(=O)$_2$Ar³, —CR²=CR² (Ar³), tosylate, triflate, OSO$_2$R², a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R², where one or more non-adjacent CH$_2$ groups may be replaced by R²C=CR², C≡C, Si(R²)$_2$, Ge(R²)$_2$, Sn(R²)$_2$, C=O, C=S, C=Se, C=NR², P(=O)(R²), SO, SO$_2$, NR², O, S or CONR² and where one or more H atoms may be replaced by F, Cl, Br, I, CN or NO$_2$, or a combination of these systems; where two or more adjacent substituents R¹ may also be linked to one another via a single covalent bond or a divalent group Z;

X is selected from the group consisting of C, P(Ar⁴), S and SO;

R² is on each occurrence, identically or differently, a straight-chain alkyl group having 1 to 20 C atoms or a branched or cyclic alkyl group having 3 to 20 C atoms, where one or more non-adjacent CH$_2$ groups may be replaced by NH, O or S and where one or more H atoms may be replaced by F, or a mono- or polycyclic, aromatic or heteroaromatic ring system having 5 to 20 aromatic ring atoms, which may in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent CH$_2$ groups may be replaced by NH, O or S and where one or more H atoms may be replaced by F; where two or more substituents R³ may also be linked to one another via a single covalent bond or a divalent group Z;

Ar³ and Ar⁴ are on each occurrence, identically or differently, a mono- or polycyclic, aromatic or heteroaromatic ring system having 5 to 60 aromatic ring atoms, which may be substituted by one or more radicals R³;

Z represents a divalent group —(CR⁴$_2$)$_q$—;

q is equal to 1, 2, 3, 4 or 5, preferably 1, 2, 3 or 4, particularly preferably 1, 2 or 3, and in particular 1 or 2;

R⁴ is, identically or differently on each occurrence, a straight-chain alkyl group having 1 to 20 C atoms or a branched or cyclic alkyl group having 3 to 20 C atoms, where one or more non-adjacent CH$_2$ groups may be replaced by NH, O or S and where one or more H atoms may be replaced by F.

The structural unit of the formula (I) is preferably an electron-transporting unit.

DETAILED DESCRIPTION OF THE INVENTION

Figure 1:
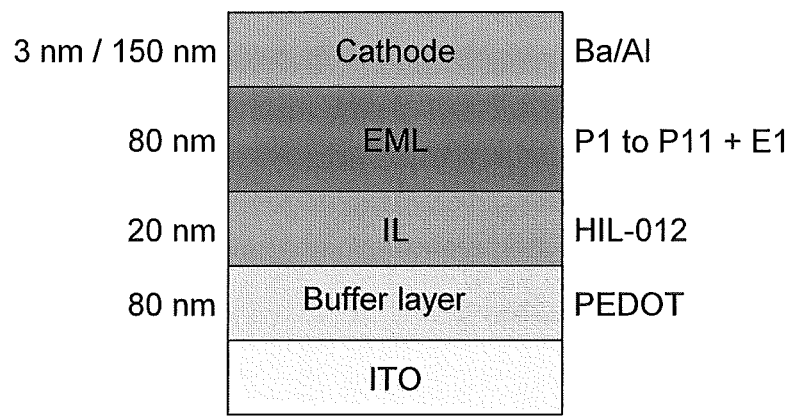
FIG. 1 is a device structure of an electroluminescent device.

In the present application, the term polymer is taken to mean both polymeric compounds, oligomeric compounds and dendrimers. The polymeric compounds according to the invention preferably have 10 to 10000, particularly preferably 20 to 5000 and in particular 50 to 2000 structural units. The oligomeric compounds according to the invention preferably have 3 to 9 structural units. The branching factor of the polymers here is between 0 (linear polymer, no branching points) and 1 (fully branched dendrimer).

The term "dendrimer" in the present application is intended to be taken to mean a highly branched compound which is built up from a multifunctional centre (core), to which branched monomers are bonded in a regular structure, so that a tree-like structure is obtained. Both the centre and the monomers can adopt any desired branched structures here which consist both of purely organic units and also organometallic compounds or coordination compounds. "Dendrimer" here is generally intended to be understood as described, for example, by M. Fischer and F. Vögtle (*Angew. Chem., Int. Ed.* 1999, 38, 885).

An organic electroluminescent device is taken to mean a device which comprises anode, cathode and at least one emitting layer which is arranged between the anode and the cathode, where at least one layer between the anode and the cathode comprises at least one organic or organometallic compound. The emitting layer here preferably comprises at least one polymer according to the invention which comprises at least one structural unit of the formula (I) in the side chains, either as matrix material or, if the polymer also has emitting units, as emitting material. An organic electroluminescent device does not necessarily have to comprise only layers which are built up from organic or organometallic materials. Thus, it is also possible for one or more layers to comprise inorganic materials or to be built up entirely from inorganic materials.

A fluorescent compound in the sense of the present invention is a compound which exhibits luminescence from an excited singlet state at room temperature. For the purposes of the present invention, all luminescent compounds which contain no heavy atoms, i.e. no atoms having an atomic number greater than 36, are, in particular, intended to be regarded as fluorescent compounds.

A phosphorescent compound in the sense of the present invention is a compound which exhibits luminescence from an excited state having relatively high spin multiplicity, i.e. a spin state>1, in particular from an excited triplet state, at room temperature. For the purposes of the present invention, all luminescent compounds which contain heavy atoms, preferably atoms having an atomic number greater than 36, particularly preferably iridium and platinum compounds, are, in particular, intended to be regarded as phosphorescent compounds.

For the purposes of the present application, a straight-chain, branched or cyclic alkyl group is taken to mean an alkyl, alkenyl and alkynyl groups preferably having 1 to 40 C atoms, particularly preferably 1 to 20 C atoms, or 3 to 40 C atoms, in particular 3 to 20 C atoms. Cyclic alkyl groups can be mono-, bi- or polycyclic alkyl groups. Individual —CH— or —CH$_2$— groups may be replaced by N, NH, O or S. Preference is given to the radicals methyl, ethyl, n-propyl, i-propyl, n-butyl, i-butyl, s-butyl, t-butyl, 2-methylbutyl, n-pentyl, s-pentyl, t-pentyl, cyclopentyl, n-hexyl, cyclohexyl, n-heptyl, cycloheptyl, n-octyl, cyclooctyl, 2-ethylhexyl, trifluoromethyl, pentafluoro-ethyl, 2,2,2-trifluoroethyl, ethenyl, propenyl, butenyl, pentenyl, cyclopentenyl, hexenyl, cyclohexenyl, heptenyl, cycloheptenyl, octenyl, cyclo-octenyl, ethynyl, propynyl, butynyl, pentynyl, hexynyl, heptynyl and octynyl.

An alkoxy group or thioalkyl group is taken to mean an alkyl group as defined above which is bonded via an O or S atom.

Preferred alkoxy groups are methoxy, trifluoromethoxy, ethoxy, n-propoxy, i-propoxy, n-butoxy, i-butoxy, s-butoxy, t-butoxy and 2-methylbutoxy.

An alkylene group in the present invention is taken to mean an alkyl group as defined above in which two hydrogen radicals are not present and have been replaced by the further bond.

A mono- or polycyclic, aromatic ring system in the sense of the present application is preferably taken to mean an aromatic ring system having 6 to 60 carbon atoms, particularly preferably 6 to 30, in particular 6 to 12 carbon atoms. An aromatic ring system in the sense of the present application is intended to be taken to mean a system which does not necessarily comprise only aromatic groups, but instead in which, in addition, a plurality of aromatic groups may be interrupted by a short non-aromatic unit (<10% of the atoms other than H, preferably <5% of the atoms other than H), such as, for example, sp$^3$-hybridised C, O, N, etc., or a CO group These aromatic ring systems may be monocyclic or polycyclic, i.e. they may contain one ring (for example phenyl) or two or more rings, which may also be condensed (for example naphthyl) or covalently bonded (for example biphenyl), or contain a combination of condensed and linked rings.

Preferred aromatic ring systems are, for example, benzene, biphenyl, terphenyl, naphthalene, anthracene, binaphthyl, phenanthrene, benzanthracene, dihydrophenanthrene, pyrene, dihydropyrene, chrysene, perylene, tetracene, pentacene, benzopyrene, fluorene, spirobifluorene and indene.

A mono- or polycyclic, heteroaromatic ring system in the sense of this invention is preferably taken to mean a heteroaromatic ring system having 5 to 40 ring atoms, particularly preferably 5 to 30, in particular 5 to 14 ring atoms. The heteroaromatic ring system contains at least one heteroatom selected from N, O and S (the remaining atoms are carbon). A heteroaromatic ring system is in addition intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, sp$^3$-hybridised C, O, N, etc., or a CO group. These heteroaromatic ring systems can be monocyclic or polycyclic, i.e. they may contain one ring (for example pyridyl) or two or more rings, which may also be condensed or covalently bonded, or contain a combination of condensed and linked rings.

Preferred heteroaromatic ring systems are, for example, 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene, or combinations of these groups. Particular preference is given to imidazole, benzimidazole and pyridine.

A divalent mono- or polycyclic, aromatic or heteroaromatic ring system is taken to mean a mono- or polycyclic, aromatic or heteroaromatic ring system as described above in which one hydrogen radical is not present and has been replaced by the further bond.

An aryloxy or heteroaryloxy group having 5 to 60 aromatic ring atoms is taken to mean a group which carries a mono- or polycyclic, aromatic or heteroaromatic ring system having 5 to 60 aromatic ring atoms as described above via an O atom.

In a further embodiment of the present invention, L in the structural unit of the formula (I) is preferably a single covalent bond.

In a further embodiment of the present invention, Ar$^1$ in the structural unit of the formula (I) is preferably selected from the group consisting of phenyl, biphenyl, fluorene, carbazole, phenanthrene, dihydrophenanthrene, spirobifluorene, pyridyl, furanyl, naphthyl, anthracyl, pyrene, dihydropyrene, chrysene, perylene, tetracene, pentacene and benzopyrene, each of which may be substituted by one or more radicals R$^1$. Ar$^1$ in the structural unit of the formula (I) is particularly preferably phenyl, biphenyl, fluorene, carbazole and spirobifluorene.

The present invention likewise encompasses an embodiment in which Ar$^2$ in the structural unit of the formula (I) is preferably selected from the group consisting of phenylene, biphenylene, fluorene, carbazole, phenanthrene, dihydrophenanthrene, spirobifluorene, pyridylene, furan, naphthylene, anthracylene, pyrene, dihydropyrene, chrysene, perylene, tetracene, pentacene and benzopyrene, each of which may be substituted by one or more radicals R$^1$. Ar$^2$ in the structural unit of the formula (I) is particularly preferably phenyl, biphenyl, fluorene, carbazole and spirobifluorene.

In a further embodiment of the present invention, m in the structural unit of the formula (I) is preferably equal to 1.

In a further preferred embodiment, X in the structural unit of the formula (I) is likewise equal to C or P(Ph) (Ph=phenyl), particularly preferably C.

Preferred structural units of the formula (I) are depicted below:

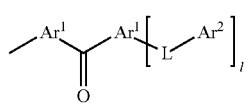

formula (I.I)

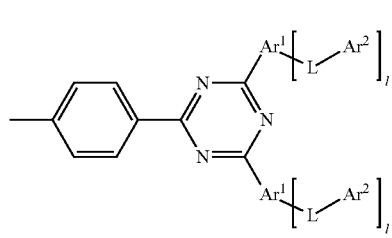
formula (I.II)
Particularly preferred structural units of the formula (I) are depicted below:
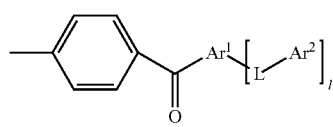
formula (I.Ia)
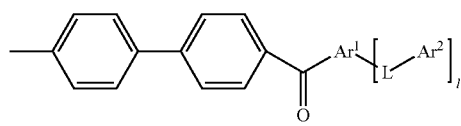
formula (I.Ib)
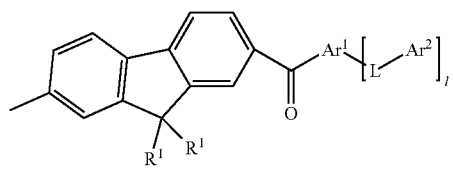
formula (I.Ic)
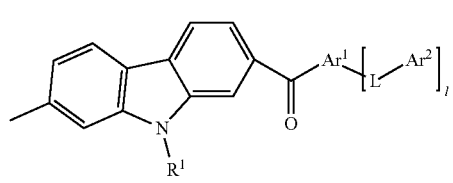
formula (I.Id)
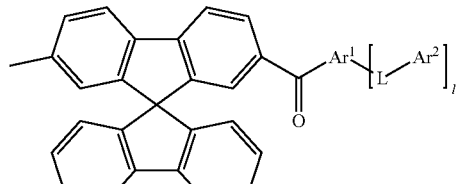
formula (I.Ie)
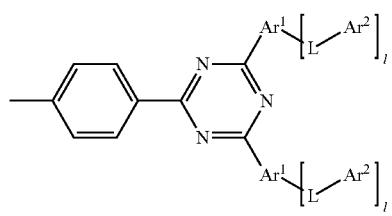
formula (I.IIa)
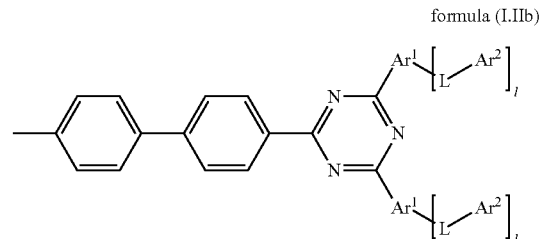
formula (I.IIb)
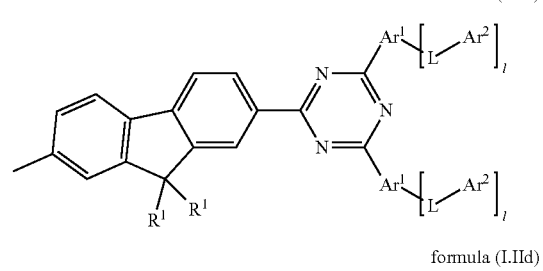
formula (I.IIc)
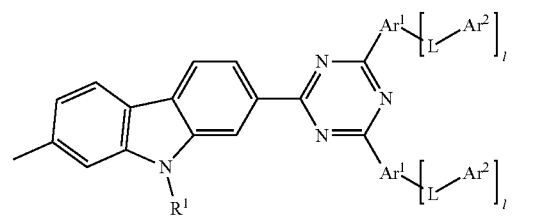
formula (I.IId)
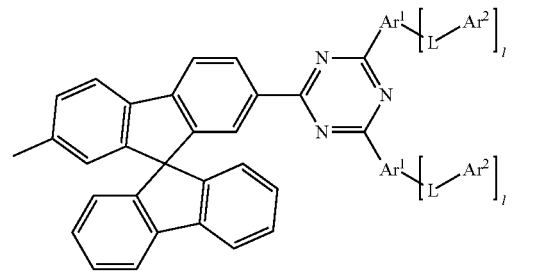
formula (I.IIe)
Especially preferred structural units of the formula (I) are depicted below:
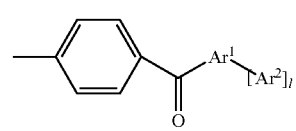
formula (I.If)
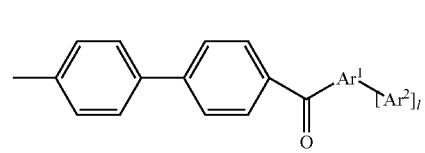
formula (I.Ig)
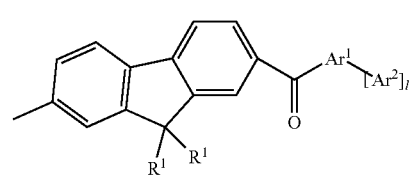
formula (I.h)

-continued

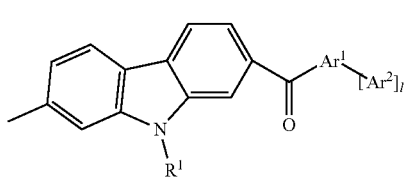
formula (I.Ii)

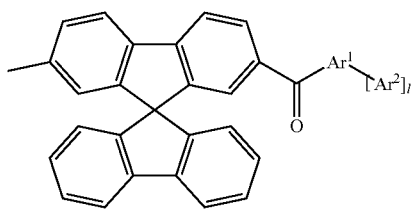
formula (I.Ij)

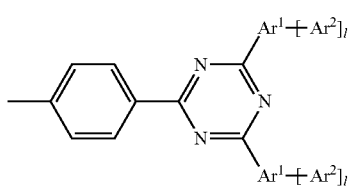
formula (I.IIf)

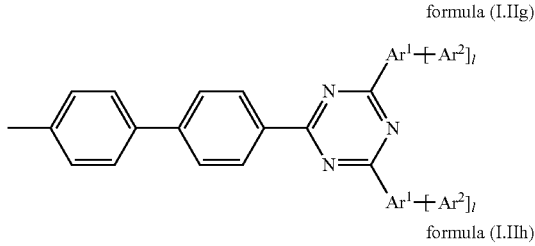
formula (I.IIg)

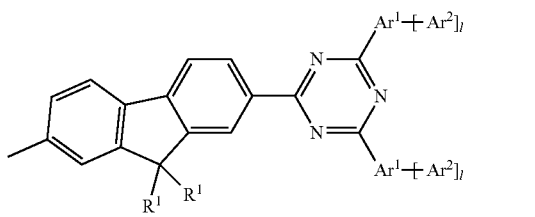
formula (I.IIh)

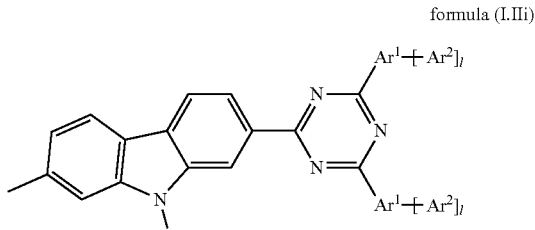
formula (I.IIi)

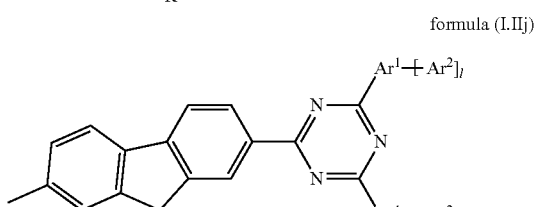
formula (I.IIj)

In the preferred, particularly preferred and especially preferred structural units depicted above, the other aromatic and heteroaromatic ring systems besides the groups $Ar^1$ and $Ar^2$ may also be substituted by one or more radicals $R^1$.

Besides the side chains containing the structural units of the formula (I), the polymers according to the invention may include one or more further side chains which contain at least one further structural unit.

For the purposes of the present invention, it is also conceivable for the polymers according to the invention to include, besides the structural units of the formula (I), a plurality of further side chains which contain various further structural units. This (these) further structural unit(s) are preferably selected from the group consisting of electron-transporting units, hole-transporting units, charge-neutral units and emitting units.

In a further embodiment of the present invention, the polymers according to the invention preferably also contain, besides one or more structural units of the general formula I, at least one further structural unit which is different from the structural unit of the formula I. These are, inter alia, those as disclosed and extensively listed in WO 02/077060 A1 and in WO 2005/014689 A2. These are regarded as part of the present invention by way of reference. The further structural units can originate, for example, from the following classes:

Group 1: units which influence the hole-injection and/or hole-transport properties of the polymers;
Group 2: units which influence the electron-injection and/or electron-transport properties of the polymers;
Group 3: units which have combinations of individual units from group 1 and group 2;
Group 4: units which modify the emission characteristics to such an extent that electrophosphorescence can be obtained instead of electrofluorescence;
Group 5: units which improve transfer from the so-called singlet state to the triplet state;
Group 6: units which influence the emission colour of the resultant polymers;
Group 7: units which are typically used as backbone;
Group 8: units which influence the film morphology and/or rheological properties of the resultant polymers.

Preferred polymers according to the invention are those in which at least one structural unit has charge-transport properties, i.e. which contain units from group 1 and/or 2.

Structural units from group 1 which have hole-injection and/or hole-transport properties are, for example, triarylamine, benzidine, tetraaryl-paraphenylenediamine, triarylphosphine, phenothiazine, phenoxazine, dihydrophenazine, thianthrene, dibenzo-para-dioxin, phenoxathiyne, carbazole, azulene, thiophene, pyrrole and furan derivatives and further O-, S- or N-containing heterocycles having a high HOMO (HOMO=highest occupied molecular orbital). These arylamines and heterocycles preferably result in an HOMO in the polymer of greater than −5.8 eV (against vacuum level), particularly preferably greater than −5.5 eV.

A structural unit from group 1, which may be in the form of a side chain in the polymer according to the invention, is a unit of the following formula (II)

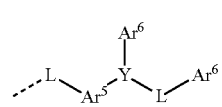
formula (II)

where the dashed line represents the connection to the polymer backbone, and the symbol L has the same meanings as in relation to formula (I), and the other symbols used have the following meanings:

Y is a trivalent unit which is selected from the group consisting of N, B, Si(Ar$^4$), SiR$^5$, Ge(Ar$^4$), GeR$^5$, P and As;

Ar$^5$ is a divalent mono- or polycyclic, aromatic or heteroaromatic ring system having 5 to 60 aromatic ring atoms, which may be substituted by one or more radicals R$^1$;

Ar$^6$ is a mono- or polycyclic, aromatic or heteroaromatic ring system having 5 to 60 aromatic ring atoms, which may be substituted by one or more radicals R$^1$;

R$^5$ is on each occurrence, identically or differently, H, D, F, Cl, Br, I, N(Ar$^3$)$_2$, CN, NO$_2$, Si(R$^2$)$_3$, B(OR$^2$)$_2$, C(=O)Ar$^3$, P(=O)(Ar$^3$)$_2$, S(=O)Ar$^3$, S(=O)$_2$Ar$^3$, —CR$^2$=CR$^2$(Ar$^3$), tosylate, triflate, OSO$_2$R$^2$, a straight-chain alkyl, alkoxy or thioalkoxy group having 1 to 40 C atoms or a branched or cyclic alkyl, alkoxy or thioalkoxy group having 3 to 40 C atoms, each of which may be substituted by one or more radicals R$^2$, where one or more non-adjacent CH$_2$ groups may be replaced by R$^2$C=CR$^2$, C≡C, Si(R$^2$)$_2$, Ge(R$^2$)$_2$, Sn(R$^2$)$_2$, C=O, C=S, C=Se, C=NR$^2$, P(=O)(R$^2$), SO, SO$_2$, NR$^2$, O, S or CONR$^2$ and where one or more H atoms may be replaced by F, Cl, Br, I, CN or NO$_2$, or an aryloxy or heteroaryloxy group having 5 to 60 aromatic ring atoms, which may be substituted by one or more radicals R$^2$, or a combination of these systems; where two or more adjacent substituents R$^5$ may also be linked to one another via a single covalent bond or a divalent group Z;

where R$^1$, R$^2$, Ar$^3$, Ar$^4$ and Z have the same meanings as defined above in relation to formula (I).

Examples of a structural unit of the formula (II) are the following:

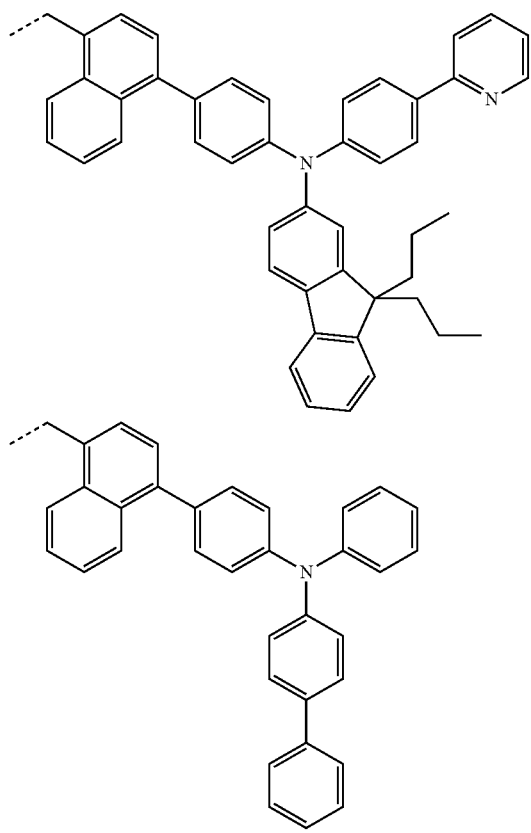

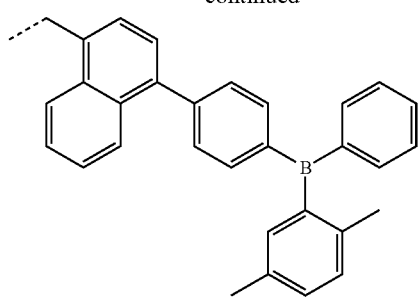

A further structural unit from group 1, which may be in the form of a side chain in the polymer according to the invention, is a unit of the following formula (III)

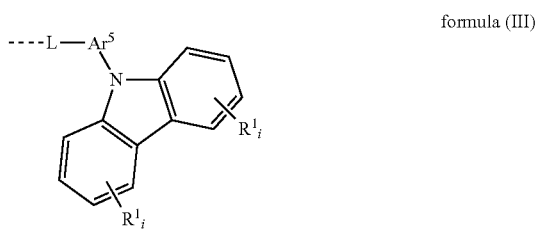

formula (III)

where the dashed line represents the connection to the polymer backbone, the non-specific bonds which end in the centre of the aromatic rings are intended to indicate that the radical R$^1$ may sit at each of positions 1 to 8 of the carbazole, the symbols L, R$^1$ and Ar$^5$ have the same meanings as in relation to formula (I), and the index i is equal to 0, 1, 2, 3 or 4.

An example of a structural unit of the formula (III) is the following:

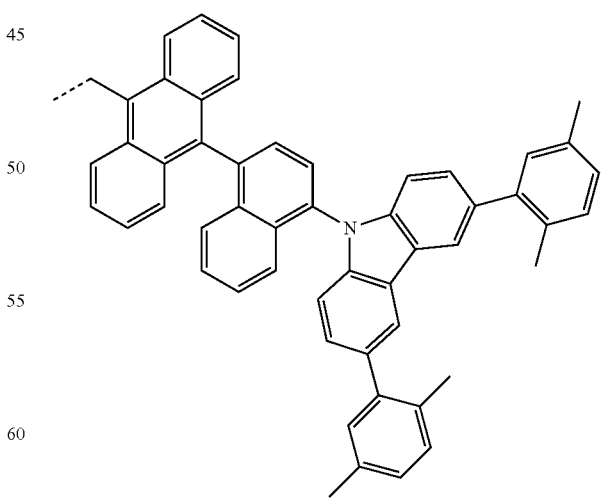

A further structural unit from group 1, which may be in the form of a side chain in the polymer according to the invention, is a unit of the following formula (IV)

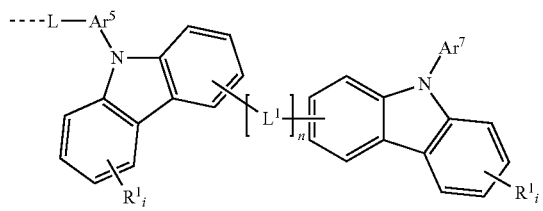

formula (IV)

where the dashed line represents the connection to the polymer backbone, the non-specific bonds which end in the centre of the aromatic rings are intended to indicate that the symbols $R^1$ and $L^1$ may each sit at each of the corresponding positions 1 to 8 of the carbazole, the symbols L, $R^1$ and $Ar^5$ and the index i have the same meanings as in relation to formula (I) or (III), and the other symbols and indices used have the following meanings:

$L^1$ is on each occurrence, identically or differently, a single covalent bond or a straight-chain alkylene group having 1 to 20 C atoms or a branched or cyclic alkylene group having 3 to 20 C atoms, each of which may be substituted by one or more radicals $R^1$, where one or more non-adjacent $CH_2$ groups may be replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms may be replaced by F, Cl, Br, I, CN or $NO_2$;

n is equal to 0, 1, 2 or 3, with the proviso that, if n>1, a maximum of one $L^1$ may be an aromatic or heteroaromatic ring system;

$Ar^7$ is a mono- or polycyclic, aromatic or heteroaromatic ring system having 5 to 60 aromatic ring atoms, which may be substituted by one or more radicals $R^1$.

An example of a structural unit of the formula (IV) is the following:

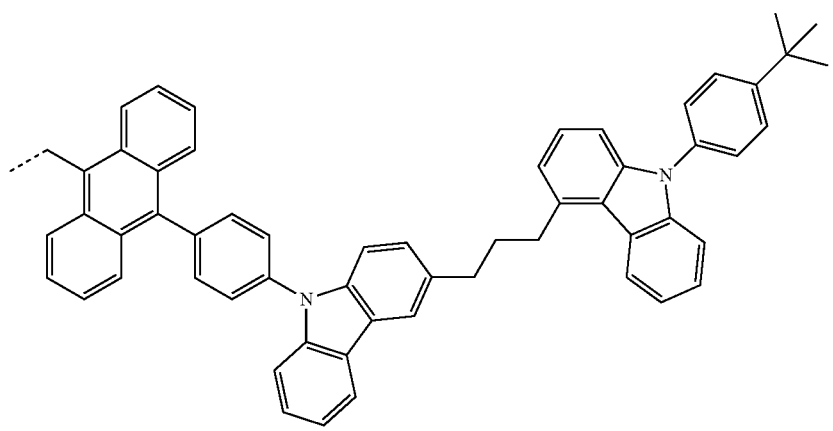

Structural units from group 2 which have electron-injection and/or electron-transport properties are, for example, pyridine, pyrimidine, pyridazine, pyrazine, oxadiazole, quinoline, quinoxaline, anthracene, benzanthracene, pyrene, perylene, benzimidazole, triazine, ketone, phosphine oxide and phenazine derivatives, but also triarylboranes and further O-, S- or N-containing heterocycles having a low LUMO (LUMO=lowest unoccupied molecular orbital). These units in the polymer preferably result in an LUMO of less than −2.5 eV (against vacuum level), particularly preferably less than −2.7 eV.

It may be preferred for the polymers according to the invention to contain units from group 3 in which structures which increase the hole mobility and structures which increase the electron mobility (i.e. units from groups 1 and 2) are bonded directly to one another or structures which increase both the hole mobility and the electron mobility. Some of these units can serve as emitters and shift the emission colour into the green, yellow or red. Their use is thus suitable, for example, for the generation of other emission colours from originally blue-emitting polymers.

Structural units from group 4 are those which are able to emit light from the triplet state with high efficiency, even at room temperature, i.e. exhibit electrophosphorescence instead of electrofluorescence, which frequently causes an increase in the energy efficiency. Suitable for this purpose are firstly compounds which contain heavy atoms having an atomic number of greater than 36. Preference is given to compounds which contain d- or f-transition metals which satisfy the above-mentioned condition. Particular preference is given here to corresponding structural units which contain elements from groups 8 to 10 (Ru, Os, Rh, Ir, Pd, Pt). Suitable structural units for the polymers according to the invention here are, for example, various complexes, as described, for example, in WO 02/068435 A1, WO 02/081488 A1, EP 1239526 A2 and WO 2004/026886 A2. Corresponding monomers are described in WO 02/068435 A1 and in WO 2005/042548 A1.

A structural unit from group 4 which may be in the form of a side chain in the polymer according to the invention is a unit of the following formula (V)

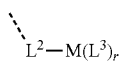

formula (V)

where the dashed line represents the connection to the polymer backbone, and the symbols and indices used have the following meanings:

L² and L³ are, independently of one another, on each occurrence, identically or differently, a mono- or polydentate ligand;

M is preferably a transition metal, a main-group metal, a lanthanoid or an actinoid;

r is equal to 0, 1, 2, 3, 4, 5, 6 or 7, depending on the denticity of the ligands L² and L³ and the coordination number of the metal M.

A mono- or polydentate ligand is taken to mean a compound which is able to form one or coordination bond(s) with a metal. The ligand preferably forms an organometallic compound unit with the central metal. The organometallic compound unit is preferably an organometallic coordination compound. An organometallic coordination compound is taken to mean a compound having a metal atom or ion in the centre of the compound surrounded by an organic compound as ligand. An organometallic coordination compound is additionally characterised in that a carbon atom of the ligand is bonded to the central metal via a coordination bond.

It is furthermore preferred for the organic ligand to be a chelate ligand. A chelate ligand is taken to mean a bi- or multidentate ligand, which is able to bond to the central metal correspondingly via two or more atoms.

The ligand L² and L³ is preferably an organic ligand which includes a unit (referred to as ligand unit below) which is represented by the following formula (VI):

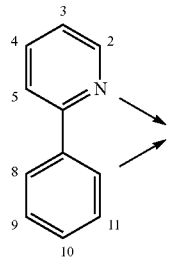

formula (VI)

where the atoms from which the arrows point away are coordinated to the metal atom, and the numerals 2 to 5 and 8 to 11 merely represent a numbering in order to distinguish the C atoms. The organic ligand unit of the formula (VI) may, instead of hydrogen at positions 2, 3, 4, 5, 8, 9, 10 and 11, have, independently of one another, a substituent which is selected from the group consisting of $C_{1-6}$-alkyl, $C_{6-20}$-aryl, 5- to 14-membered heteroaryl and further substituents.

The expression "$C_{1-6}$-alkyl" used herein denotes a linear or branched alkyl group having 1 to 6 carbon atoms. Examples of such carbon atoms are methyl, ethyl, n-propyl, isopropyl, n-butyl, isobutyl, sec-butyl(1-methylpropyl), tert-butyl, isopentyl, n-pentyl, tert-pentyl(1,1-dimethylpropyl), 1,2-dimethylpropyl, 2,2-dimethylpropyl(neopentyl), 1-ethylpropyl, 2-methylbutyl, n-hexyl, isohexyl, 1,2-dimethylbutyl, 1-ethyl-1-methylpropyl, 1-ethyl-2-methylpropyl, 1,1,2-trimethylpropyl, 1,2,2-trimethylpropyl, 1-ethylbutyl, 1-methylbutyl, 1,1-dimethylbutyl, 2,2-dimethylbutyl, 1,3-dimethylbutyl, 2,3-dimethylbutyl, 3,3-dimethylbutyl, 2-ethylbutyl, 1-methylpentyl, 2-methylpentyl, 3-methylpentyl and the like, where methyl and ethyl are preferred.

The expression "$C_{6-20}$-aryl" denotes an aromatic ring system having 6 to 20 carbon atoms. An aromatic or heteroaromatic ring system in the sense of the present invention is intended to be taken to mean a system which does not necessarily contain only aromatic or heteroaromatic groups, but instead in which, in addition, a plurality of aromatic or heteroaromatic groups may be interrupted by a short non-aromatic unit (<10% of the atoms other than H, preferably <5% of the atoms other than H), such as, for example, $sp^3$-hybridised C, O, N, etc.

Aromatic groups may be monocyclic or polycyclic, i.e. they may contain one ring (for example phenyl) or two or more rings, which may also be condensed (for example naphthyl) or covalently linked (for example biphenyl), or contain a combination of condensed and linked rings. Preference is given to fully conjugated aromatic groups.

Preferred aromatic ring systems are, for example, phenyl, biphenyl, triphenyl, naphthyl, anthracene, binaphthyl, phenanthrene, dihydrophenanthrene, pyrene, dihydropyrene, chrysene, perylene, tetracene, benzopyrene, fluorene, indene, indenofluorene and spirobifluorene.

"5- to 14-membered heteroaryl" is taken to mean an aromatic group in which one or more carbon atom(s) has (have) been replaced by an N, O or S. Examples thereof include the following: 5-membered rings, such as pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, isoindole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, isobenzothiophene, dibenzothiophene, benzothiadiazothiophene or combinations of these groups. The heteroaryl groups may also be substituted by alkyl, alkoxy, thioalkyl, fluorine, fluoroalkyl or further aryl or heteroaryl groups.

Further possible substituents on the ligand unit of the formula (I) are preferably selected from the group consisting of silyl, sulfo, sulfonyl, formyl, amine, imine, nitrile, mercapto, nitro, halogen, hydroxyl or combinations of these groups. Preferred substituents are, for example, solubility-promoting groups, such as alkyl or alkoxy, electron-withdrawing groups, such as fluorine, nitro or nitrile, or substituents for increasing the glass transition temperature (Tg) in the polymer. Particularly preferred substituents are, for example, F, Cl, Br, I, —CN, —NO₂, —NCO, —NCS, —OCN, —SCN, —C(=O)N(R)₂, —C(=O)R, —C(=O)R and —N(R)₂, in which R is a hydrogen, alkyl or aryl, optionally substituted silyl, aryl having 4 to 40, preferably 6 to 20, C atoms, and straight-chain or branched alkyl, alkoxy, alkylcarbonyl, alkoxycarbonyl, alkylcarbonyloxy or alkoxycarbonyloxy having 1 to 22 C atoms, in which one or more H atoms may optionally be replaced by F or Cl.

It is furthermore preferred for two adjacent carbon atoms on the phenyl ring or pyridyl ring of the ligand unit of the formula (I) to be bridged via a —CH=CH—CH=CH— group, where a naphthyl unit forms in the case of the phenyl ring and an azanaphthyl unit forms in the case of the pyridyl ring. These may in turn carry via a further —CH=CH—

CH=CH— group bridging via two adjacent carbon atoms. In a further preferred embodiment, the carbon atoms at positions 5 and 8 are bridged via a —CH=CH— group. Further bridges between phenyl units of the ligand unit can be divalent (CH$_3$)C— units, which are preferably linked in such a way that a further 6-membered ring forms.

Preferred examples of the ligands of the formula (VI) are the following compounds (VI-1) to (VI-10):

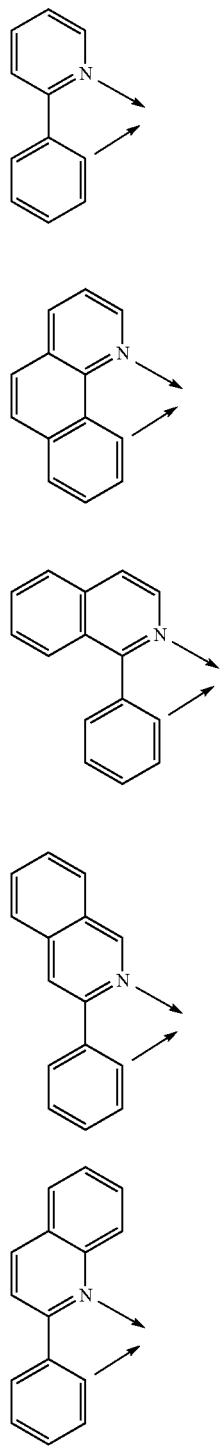

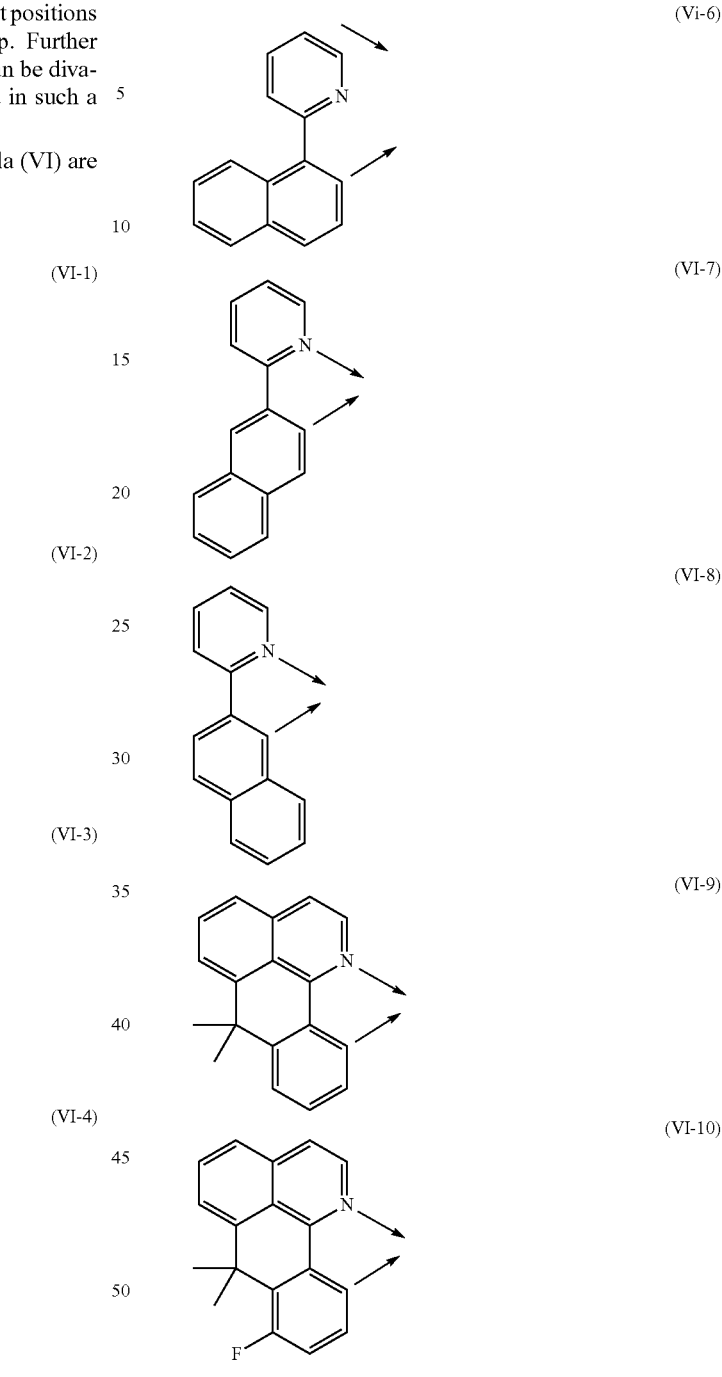

Particular preference is given in the sense of the present invention to compounds (VI-1), (VI-3) and (VI-10).

Furthermore, the ligand L$^2$ is preferably bonded to the polymer backbone via a C atom in the 2-, 3-, 4-, 5-, 8-, 9-, 10- or 11-position. The ligand is particularly preferably bonded to the polymer backbone via position 9 or 11, in particular via position 9.

Besides the above-mentioned ligand unit L$^2$, which is bonded to the polymer backbone, the coordination compound may comprise further ligands L$^3$ which are not bonded to the polymer backbone. These further ligands are likewise defined like the above-mentioned ligand L$^2$, with the difference that none of the H atoms has been replaced by a bond to the polymer. In other words, this ligand preferably contains a hydrogen radical instead of the bond to the polymer at the corresponding site. Preferred examples of the further ligand are the same as mentioned above. Particularly preferred examples are ligands of the above-mentioned formulae (VI-1) to (VI-10). The further ligand is particularly preferably a ligand of the formulae (VI-1), (VI-3) and (VI-10).

The metal of the metal-ligand coordination compound is preferably a transition metal, a main-group metal, a lanthanoid or an actinoid. If the metal is a main-group metal, it is then preferably a metal from the third, fourth or fifth main group, in particular tin. If the metal is a transition metal, it is then preferably Ir, Ru, Os, Pt, Zn, Mo, W, Rh or Pd, in particular Ir and Pt. Eu is preferred as lanthanoid.

Preference is given to metal-ligand coordination compounds in which the metal is a transition metal, in particular a tetracoordinated, pentacoordinated or hexacoordinated transition metal, particularly preferably selected from the group consisting of chromium, molybdenum, tungsten, rhenium, ruthenium, osmium, rhodium, iridium, nickel, palladium, platinum, copper, silver and gold, in particular molybdenum, tungsten, rhenium, ruthenium, osmium, iridium, platinum, copper and gold. Very particular preference is given to iridium and platinum. The metals here can be in various oxidation states. The above-mentioned metals here are preferably in the oxidation states Cr(0), Cr(II), Cr(III), Cr(IV), Cr(VI), Mo(0), Mo(II), Mo(III), Mo(IV), Mo(VI), W(0), W(II), W(III), W(IV), W(VI), Re(I), Re(II), Re(III), Re(IV), Ru(II), Ru(III), Os(II), Os(III), Os(IV), Rh(I), Rh(III), Ir(I), Ir(III), Ir(IV), Ni(0), Ni(II), Ni(IV), Pd(II), Pt(II), Pt(IV), Cu(I), Cu(II), Cu(III), Ag(I), Ag(II), Au(I), Au(III) and Au(V); very particular preference is given to Mo(0), W(0), Re(I), Ru(II), Os(II), Rh(III), Ir(III), Pt(II) and Cu(I), in particular Ir(III) and Pt(II).

In a preferred embodiment of the present invention, the metal is a tetracoordinated metal having one, two, three or four ligands. In this way, the ligands may be mono-, bi-, tri- or tetradentate ligands. If the metal is coordinated to one ligand, it is a tetradentate ligand. If the metal is coordinated to two ligands, either both ligands are bidentate ligands, or one is a tridentate ligand and one is a monodentate ligand. If the metal is coordinated to three ligands, one ligand is a bidentate ligand and two are a monodentate ligand. If the metal is coordinated to four ligands, all ligands are monodentate.

In a further preferred embodiment of the present invention, the metal is a hexacoordinated metal having one, two, three, four, five or six ligands. In this way, the ligands may be mono-, bi-, tri-, tetra-, penta- or hexadentate ligands. If the metal is coordinated to one ligand, it is a hexadentate ligand. If the metal is coordinated to two ligands, either both are tridentate ligands or one is a bidentate ligand and one is a tetradentate ligand or one is a monodentate ligand and one is a pentadentate ligand. If the metal is coordinated to three ligands, either all three ligands are bidentate ligands or one is a tridentate ligand, one is a bidentate ligand and one is a monodentate ligand or one is a tetradentate ligand and two are monodentate ligands. If the metal is coordinated to four ligands, one ligand is a tridentate ligand and three are a monodentate ligand or two are bidentate ligands and two are monodentate ligands. If the metal is coordinated to five ligands, one is a bidentate ligand and four are monodentate ligands. If the metal is coordinated to six ligands, all ligands are monodentate.

The metal centre of the organic coordination compound is preferably a metal atom in oxidation state 0 and the metal-ligand coordination compound is preferably a charge-neutral compound.

In a very particularly preferred embodiment, the metal centre is Pt or Ir. If the metal centre is Pt, it preferably has the coordination number 4. In the case of Ir as metal centre, the coordination number is preferably 6.

Furthermore, it is preferred for Pt to be coordinated by two ligand units of the formula (VI) and Ir to be coordinated by three ligand units of the formula (VI) in the manner indicated above.

Consequently, r is preferably 1 if the coordination number of the metal is 4 and the ligands $L^2$ and $L^3$ are each bidentate, and r is preferably 2 if the coordination number of the metal is 6 and the ligands $L^2$ and $L^3$ are each bidentate.

Examples of a structural unit of the formula (V) are the following:

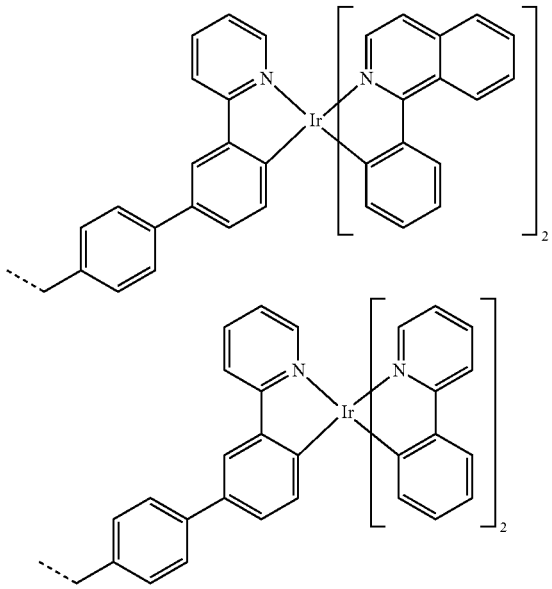

Structural units from group 5 are those which improve transfer from the singlet state to the triplet state and which, employed in support of the structural elements from group 4, improve the phosphorescence properties of these structural elements. Suitable for this purpose are, in particular, carbazole and bridged carbazole dimer units, as described, for example, in WO 2004/070772 A2 and WO 2004/113468 A1. Also suitable for this purpose are ketones, phosphine oxides, sulfoxides, sulfones, silane derivatives and similar compounds, as described, for example, in WO 2005/040302 A1.

Structural units from group 6, besides those mentioned above, are those which have at least one further aromatic structure or another conjugated structure which does not fall under the above-mentioned groups, i.e. which have only little influence on the charge-carrier mobilities, are not organometallic complexes or do not influence singlet-triplet transfer. Structural elements of this type can influence the emission colour of the resultant polymers. Depending on the unit, they can therefore also be employed as emitters. Preference is given here to aromatic structures having 6 to 40 C atoms and also to tolan, stilbene or bisstyrylarylene derivatives, each of which may be substituted by one or more radicals R. Particular preference is given here to the incorporation of 1,4-phenylene, 1,4-naphthylene, 1,4- or 9,10-anthrylene, 1,6-, 2,7- or 4,9-pyrenylene, 3,9- or 3,10-perylenylene, 4,4'-biphenylylene, 4,4''-terphenylylene, 4,4'-bi-1,1'-naphthylylene, 4,4'-tolanylene, 4,4'-stilbenzylene, 4,4''-bisstyrylarylene, benzothiadiazole and corresponding oxygen derivatives, quinoxaline, phenothiazine, phenoxazine, dihydrophenazine, bis(thiophenyl)arylene, oligo(thiophenylene), phenazine, rubrene, pentacene or perylene derivatives, which are preferably substituted, or preferably conjugated push-pull systems (systems which are substituted by donor and acceptor substituents) or systems such as squarines or quinacridones, which are preferably substituted.

Structural units from group 7 are units which contain aromatic structures having 6 to 40 C atoms, which are typically used as polymer backbone. These are, for example, 4,5-dihydropyrene derivatives, 4,5,9,10-tetra-hydropyrene derivatives, fluorene derivatives, 9,9'-spirobifluorene derivatives, phenanthrene derivatives, 9,10-dihydrophenanthrene derivatives, 5,7-dihydrodibenzoxepine derivatives and cis- and trans-indenofluorene derivatives.

Structural units from group 8 are those which influence the film morphology and/or rheological properties of the polymers, such as, for example, siloxanes, long alkyl chains or fluorinated groups, but also particularly rigid or flexible units, such as, for example, liquid crystal-forming units or cross-linkable groups.

A further structural unit which may be in the form of a side chain in the polymer according to the invention is a unit of the following formula (VII)

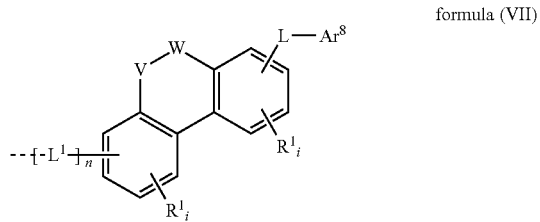

formula (VII)

where the dashed line represents the connection to the polymer backbone, the non-specific bonds which end in the centre of the aromatic rings are intended to indicate that the symbols $R^1$, L and $L^1$ may each sit at each of the free positions of the aromatic rings, the symbols $R^1$, L and $L^1$ and the indices i and n have the same meanings as in relation to formula (I) or (III), and the other symbols used have the following meanings:

V and W are selected, independently of one another, from the group consisting of $C(Ar^3)_2$, $C(R^5)_2$, $Si(Ar^3)_2$, $Si(R^5)_2$, $Ge(Ar^3)_2$, $Ge(R^5)_2$, C=O, O, S, Se, $N(Ar^4)$, $N(R^5)$, $P(Ar^4)$, $P(R^5)$, $P=O(Ar^3)$, $P=O(R^5)$, B and $(R^5)_2CO$;

$Ar^8$ is a mono- or polycyclic, aromatic or heteroaromatic ring system having 5 to 60 aromatic ring atoms, which may be substituted by one or more radicals $R^1$;

where the symbols $R^5$, $Ar^3$ and $Ar^4$ have the same meanings as defined above.

Depending on the meaning of the radicals V and W in the structural unit of the formula (VII), the structural unit can be one from group 1, 2, 5, 6 or 8.

Examples of a structural unit of the formula (VII) are the following:

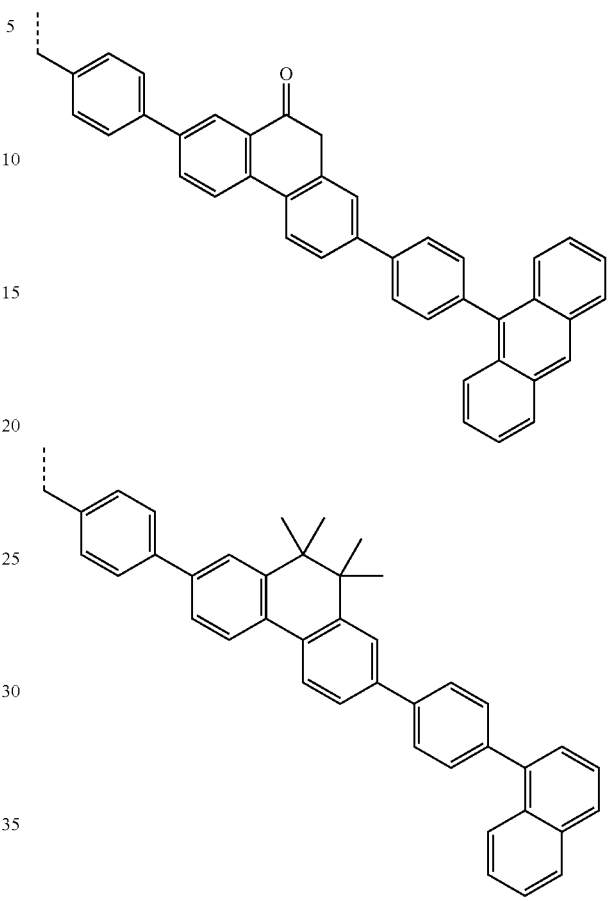

Preference is given to polymers according to the invention which, besides structural units of the formula (I), simultaneously additionally comprise one or more units selected from groups 1 to 8. It may likewise be preferred for more than one further structural unit from a group to be present at the same time.

Preference is given here to polymers according to the invention which, besides at least one structural unit of the formula (I), also comprise units from group 7, particularly preferably at least 50 mol % of these units, based on the total number of structural units in the polymer.

It is likewise preferred for the polymers according to the invention to comprise units which improve the charge transport or charge injection, i.e. units from group 1 and/or 2; a proportion of 0.5 to 30 mol % of these units is particularly preferred; a proportion of 1 to 10 mol % of these units is very particularly preferred, based on the entire recurring unit on which the functional side chain hangs. A recurring unit includes all atoms which are incorporated into the polymer by polymerisation of a monomer.

It is furthermore particularly preferred for the polymers according to the invention to comprise structural units from group 7 and units from group 1 and/or 2, in particular at least 50 mol % of units from group 7 and 0.5 to 30 mol % of units from group 1 and/or 2.

The polymers according to the invention are either homopolymers or copolymers. The polymers according to the invention may be linear or branched. Besides one or more structural units of the formula (I), copolymers according to the invention may potentially have one or more structures from the above-mentioned groups 1 to 8.

The copolymers according to the invention can have random, alternating or block-like structures or also a plurality of these structures in an alternating manner. The copolymers according to the invention particularly preferably have random or block-like structures. The copolymers are particularly preferably random or block-like copolymers. The way in which copolymers having block-like structures can be obtained and what further structural elements are particularly preferred for this purpose is described in detail, for example, in WO 2005/014688 A2. This is incorporated into the present application by way of reference. It should likewise again be emphasised at this point that the polymer may also have dendritic structures.

It may additionally be preferred for the polymers according to the invention not to be used as pure substance, but instead as a mixture (blend) together with further polymeric, oligomeric, dendritic or low-molecular-weight substances of any desired type. These may, for example, improve the electronic properties or themselves emit. Above and below, a mixture comprising at least one polymeric component according to the invention is referred to as "mixture" or "blend".

The present invention thus furthermore relates to a polymer mixture (blend) which comprises one or more polymers according to the invention, and one or more further polymeric, oligomeric, dendritic or low-molecular-weight substances.

A preferred low-molecular-weight substance in the mixture according to the invention is an emitting compound. The emitting compound is preferably a compound of the following formula (VIII)

$$M(L^3)_k \quad \text{formula (VIII)}$$

where M and $L^3$ have the same meanings as above in relation to formula (V), and k is equal to 1, 2, 3, 4, 5, 6, 7 or 8, depending on the denticity of the ligand $L^3$ and the coordination number of the metal M.

The present invention furthermore relates to solutions and formulations comprising one or more polymers or mixtures according to the invention in one or more solvent(s). The way in which such solutions can be prepared is known to the person skilled in the art and is described, for example, in WO 02/072714 A1, WO 03/019694 A2 and the literature cited therein.

These solutions can be used in order to produce thin polymer layers, for example by area-coating methods (for example spin coating) or by printing processes (for example ink-jet printing). Suitable and preferred solvents are, for example, toluene, anisole, xylene, methyl benzoate, dimethylanisole, mesitylene, tetralin, veratrol and tetrahydrofuran, and mixtures thereof.

The present invention additionally relates to processes for the preparation of the polymers according to the invention, which are characterised in that the polymers are prepared by cationic or anionic, ring-opening, free-radical or catalytic polymerisation. Monomers of the following formulae (Ia) to (VIa) can be linked to one another here either to form a homopolymer or to form a copolymer.

The present invention thus also relates to a compound of the following formula (Ia)

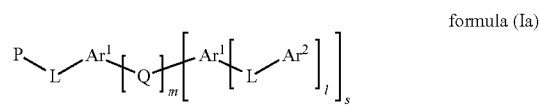

formula (Ia)

in which the symbols and indices used have the same meanings as in relation to formula (I), and the symbol P is a polymerisable group.

The polymerisable group is preferably a group which has been reacted with further polymerisable groups by ionic, ring-opening, free-radical and/or catalytic polymerisation to form a polymer.

The polymerisable group preferably comprises a double covalent bond or an oxirane ring. The following polymerisable groups can be employed here:

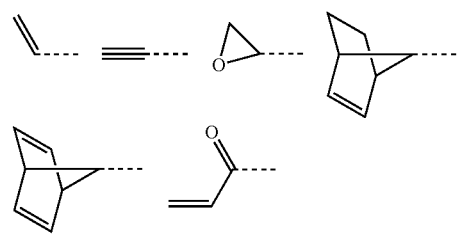

where the dashed line represents the connection to the symbol L.

Compounds of the formula (Ia) which are preferred in accordance with the invention are the following:

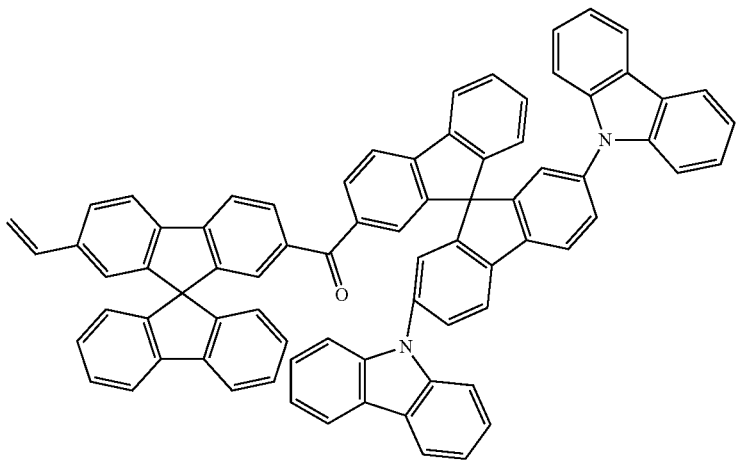

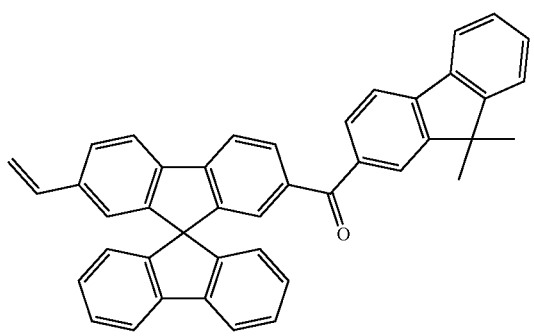
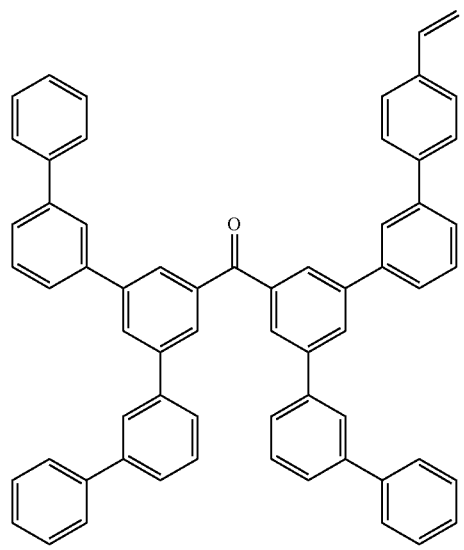
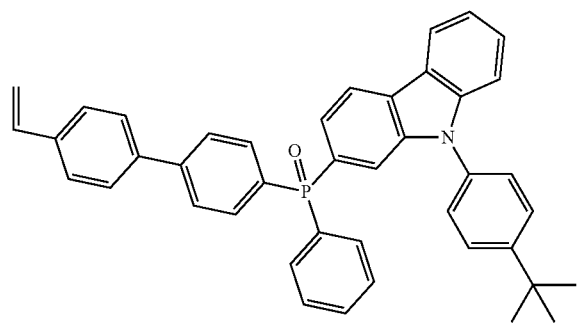
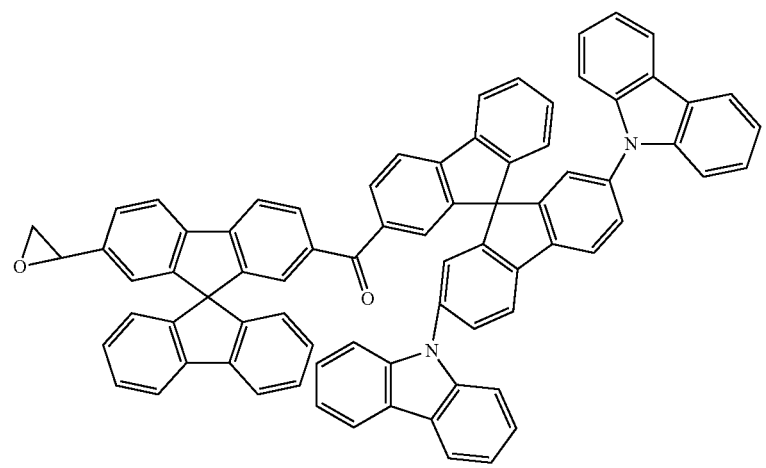

-continued
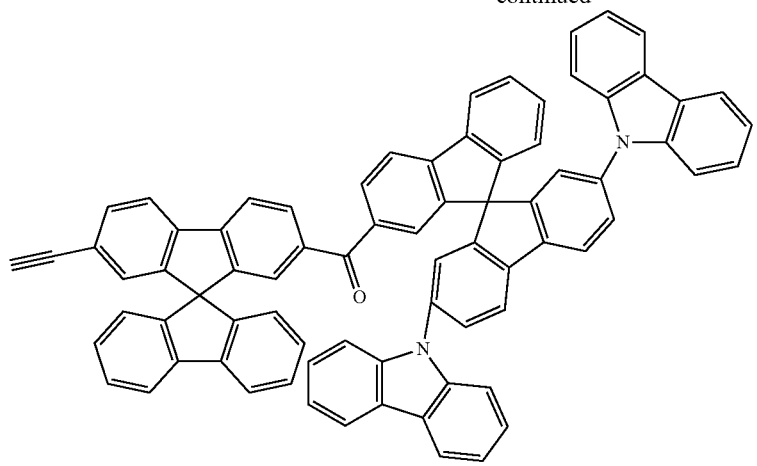
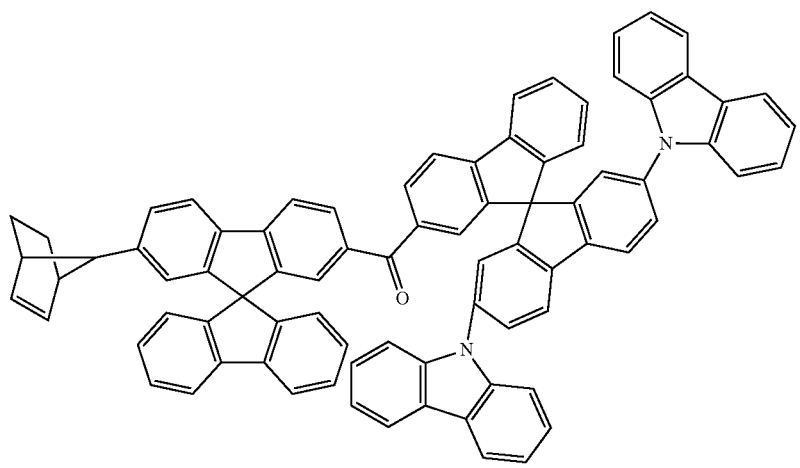
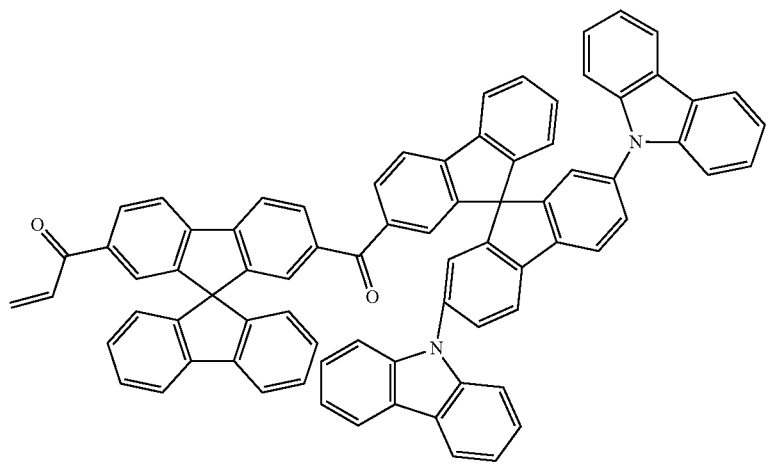

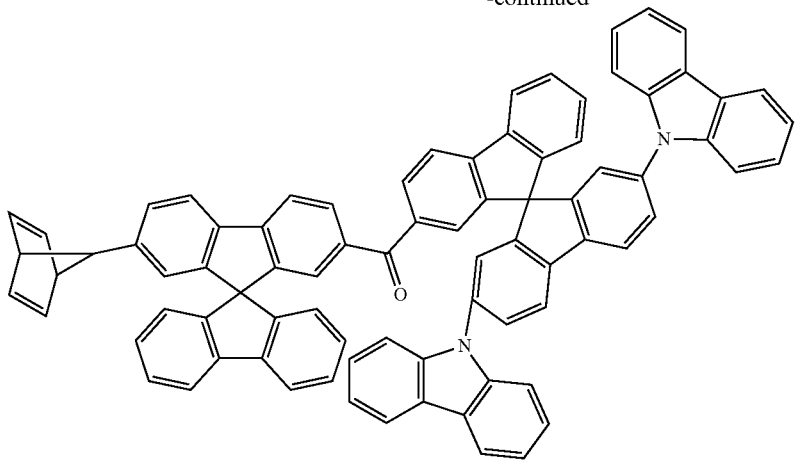

The present invention furthermore relates to a composition which comprises a compound of the formula (Ia). Besides the compound of the formula (Ia), the composition according to the invention may also comprise one or more further polymerisable compound(s). The one or more further polymerisable compound(s) here are preferably selected from the group consisting of the following compounds:

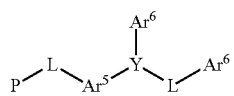

formula (IIa)

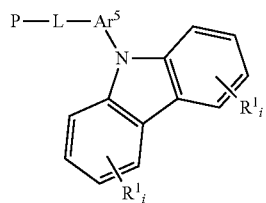

formula (IIIa)

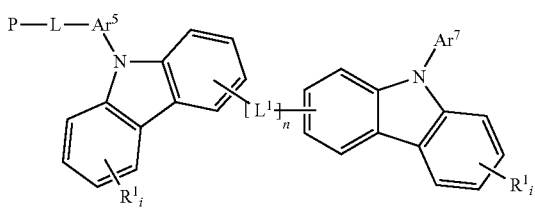

formula (IVa)

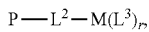

formula (Va)

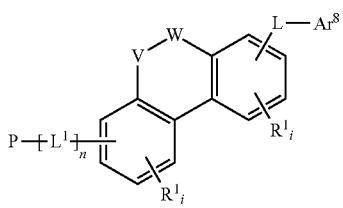

formula (VIIa)

in which the symbols and indices used have the same meanings as defined above.

Preferred compounds of the formulae (IIa) to (VIa) are the following:

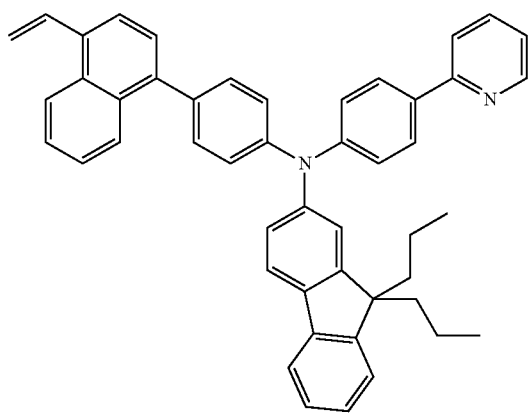
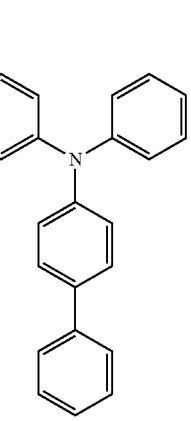

-continued
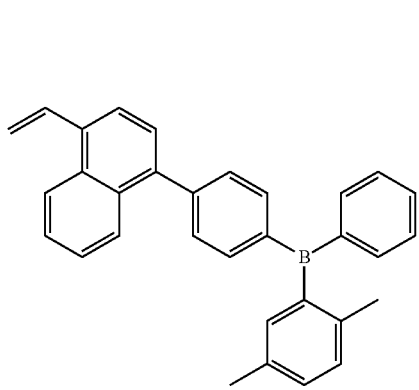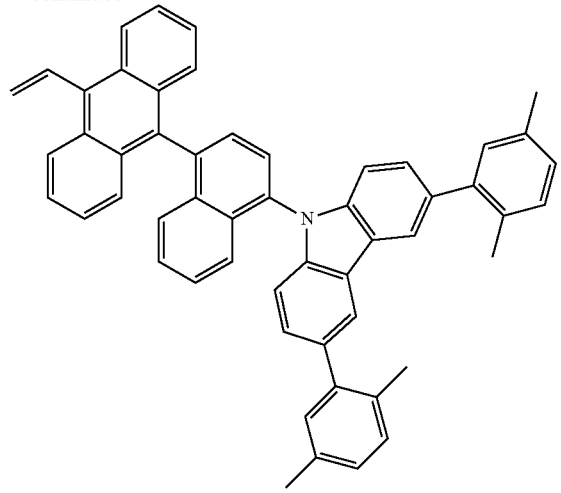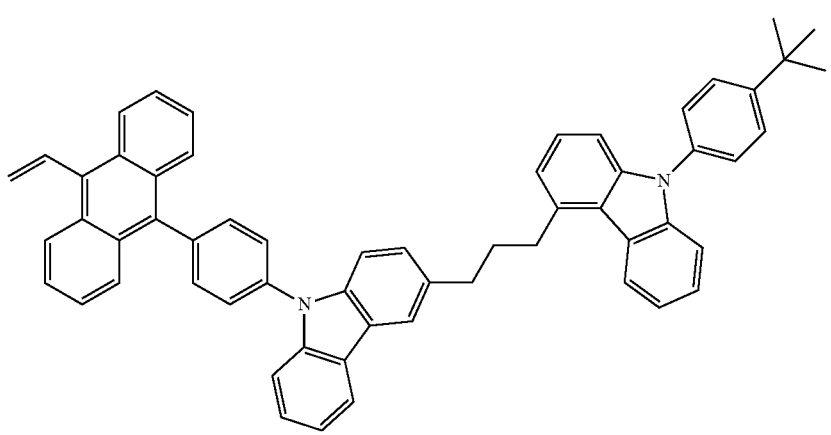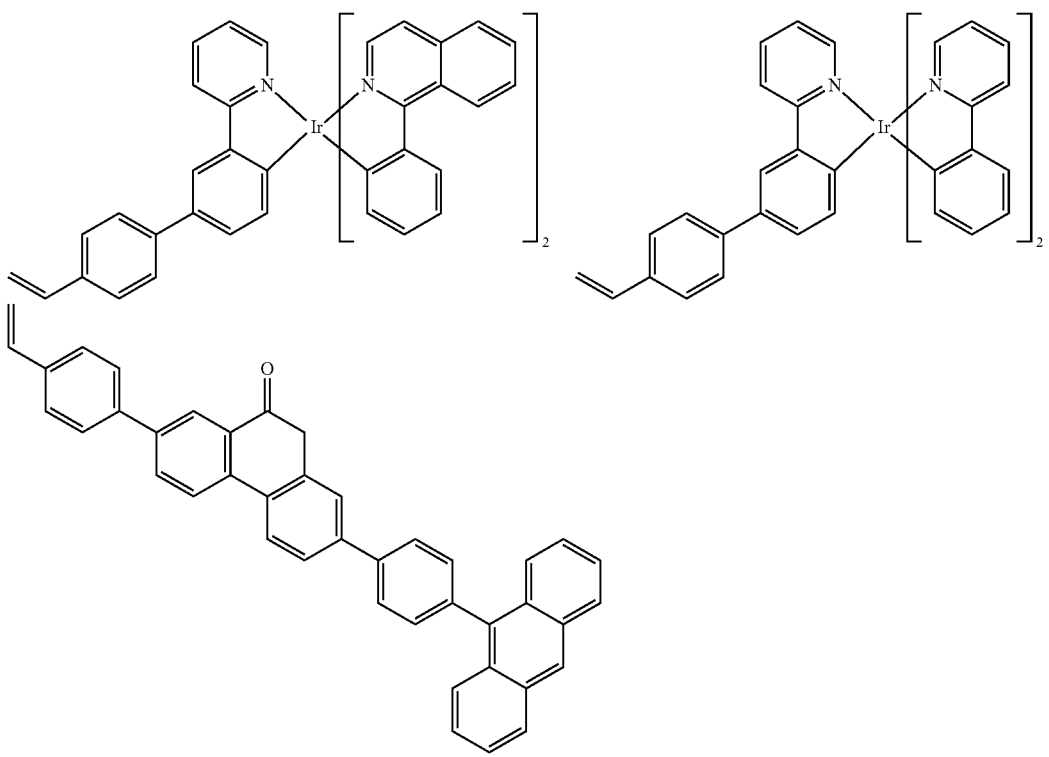

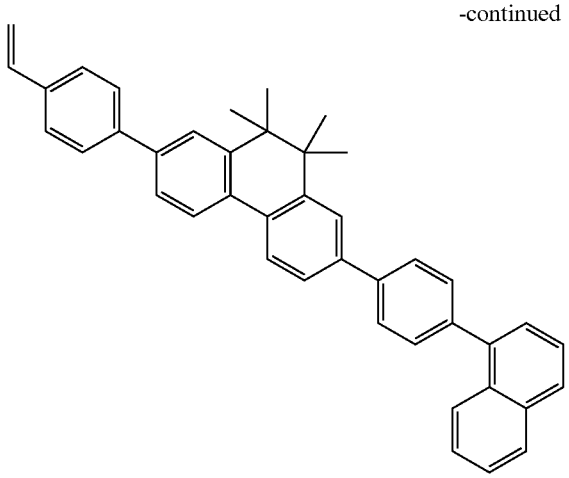

The composition according to the invention may preferably also comprise a solvent or solvent mixture.

The composition may furthermore comprise further assistants, such as stabilisers, substances which support film formation, sensitisers and the like.

The composition according to the invention can be used for the preparation of a polymer. The preparation of the polymer is preferably carried out by cationic, anionic, free-radical, ring-opening or coordinative polymerisation.

The polymer may in turn be dissolved in a solvent or solvent mixture, giving a formulation which is suitable for the production of electronic devices.

Correspondingly, the present invention furthermore relates to a formulation comprising a polymer according to the invention, as defined above, in one or more solvents. The way in which such formulations can be prepared is known to the person skilled in the art and is described, for example, in WO 02/072714, WO 03/019694 and the literature cited therein.

The formulation may furthermore comprise further components, such as, for example, further functional components (charge-transport or charge-injection units, emitter units or the like) and components which improve film formation, which serve for improvement of charge-carrier injection or conduction or for blocking individual charge carriers.

The polymer according to the invention exhibits excellent film-formation properties after application to a substrate from solution.

The polymer here is preferably applied as a layer, where the polymer is correspondingly present as a layer in the electronic device. The layer here can be a hole-transport layer, hole-injection layer, hole-blocking layer, emitter layer, electron-blocking layer, electron-transport layer, electron-injection layer and/or an interlayer. The layer is preferably an emitter layer. The corresponding functional units in the layer may either be bonded to the polymer, or the functional units may be present in the formulation as a mixture with the polymer, so that, after application of the formulation and removal of the solvent, they are distributed in the layer, but are not covalently bonded to the polymer. The layer is particularly preferably an emitter layer which comprises the polymer according to the invention either as matrix material or as emitting material. In the former case, the layer also comprises at least one emitting material besides the matrix material.

The present invention furthermore relates to an electronic device comprising a polymer, as defined above. As already stated above, it is preferred for the polymer to be present in a layer in the electronic device. Correspondingly, the layer can be a hole-transport layer, hole-injection layer, hole-blocking layer, emitter layer, electron-blocking layer, electron-transport layer, electron-injection layer and/or an interlayer, preferably an emitter layer.

The device may furthermore comprise layers which are built up from small molecules (SMOLED). These can be generated by evaporation of small molecules in a high vacuum.

It may additionally be preferred not to use the polymer as pure substance, but instead as a mixture (blend) together with further polymeric, oligomeric, dendritic or low-molecular-weight substances of any desired type. These may, for example, improve the electronic properties or themselves emit. The blend may furthermore comprise further components, such as, for example, further functional components (charge-transport or charge-injection units, emitter units or the like) and components which improve film formation or components which serve for improving charge-carrier injection or conduction or for blocking individual charge carriers. Such blends are therefore also part of the present invention.

The organic electroluminescent device comprises cathode, anode and at least one emitting layer. Apart from these layers, it may also comprise further layers, for example in each case one or more hole-injection layers, hole-transport layers, hole-blocking layers, electron-transport layers, electron-injection layers, exciton-blocking layers and/or charge-generation layers (IDMC 2003, Taiwan; Session 21 OLED (5), T. Matsumoto, T. Nakada, J. Endo, K. Mori, N. Kawamura, A. Yokoi, J. Kido, *Multiphoton Organic EL Device Having Charge Generation Layer*). Interlayers which have, for example, an exciton-blocking function may likewise be introduced between two emitting layers. However, it should be pointed out that each of these layers does not necessarily have to be present. These layers may comprise the polymers according to the invention, as defined above. It is also possible for a plurality of OLEDs to be arranged one above the other, enabling a further increase in efficiency with respect to the light yield to be achieved.

The electrodes (cathode, anode) are selected for the purposes of the present invention in such a way that their potential corresponds as closely as possible to the potential of the adjacent organic layer in order to ensure the most efficient electron or hole injection possible.

The cathode preferably comprises metals having a low work function, metal alloys or multilayered structures comprising various metals, such as, for example, alkaline-earth metals, alkali metals, main-group metals or lanthanoids (for example Ca, Ba, Mg, Al, In, Mg, Yb, Sm, etc.). In the case of multilayered structures, further metals which have a relatively high work function, such as, for example, Ag, may also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides (for example LiF, $Li_2O$, $BaF_2$, MgO, NaF, etc.). The layer thickness of this layer is preferably between 1 and 10 nm.

The anode preferably comprises materials having a high work function. The anode preferably has a potential of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. For some applications, at least one of the electrodes must be transparent in order to enable either irradiation of the organic material (O—SCs) or the coupling-out of light (OLEDs/PLEDs, O-lasers). A preferred structure uses a transparent anode. Preferred anode materials here are conductive mixed metal oxides. Particular preference is given to indium tin oxide (ITO) or indium zinc oxide (IZO). Preference is furthermore given to conductive doped organic materials, in particular conductive doped polymers.

The device is correspondingly structured in a manner known per se, depending on the application, provided with contacts and finally hermetically sealed, since the lifetime of devices of this type is drastically shortened in the presence of water and/or air.

In a preferred embodiment of the present invention, the polymers according to the invention are employed as emitting compounds in an emitting layer. The organic electroluminescent device here may comprise one emitting layer or it may comprise a plurality of emitting layers, where at least one emitting layer comprises at least one polymer according to the invention, as defined above. If a plurality of emission layers are present, these preferably have in total a plurality of emission maxima between 380 nm and 750 nm, resulting overall in white emission, i.e. various emitting compounds which are able to fluoresce or phosphoresce are used in the emitting layers. Particular preference is given to three-layer systems, where the three layers exhibit blue, green and orange or red emission (for the basic structure see, for example, WO 05/011013).

If the polymers according to the invention are employed as emitting compounds in an emitting layer, they are preferably employed in combination with one or more matrix materials. The mixture of the polymers according to the invention and the matrix material comprises between 1 and 99% by weight, preferably between 2 and 90% by weight, particularly preferably between 3 and 40% by weight, in particular between 5 and 15% by weight of the polymers according to the invention, based on the mixture as a whole comprising emitter polymer and matrix material. Correspondingly, the mixture comprises between 99 and 1% by weight, preferably between 98 and 10% by weight, particularly preferably between 97 and 60% by weight, in particular between 95 and 85% by weight of the matrix material, based on the mixture as a whole comprising emitter polymer and matrix material.

Preferred matrix materials are CBP (N,N-biscarbazolylbiphenyl), carbazole derivatives (for example in accordance with WO 05/039246, US 2005/0069729, JP 2004/288381), azacarbazoles (for example in accordance with EP 1617710, EP 1617711, EP 1731584, JP 2005/347160), ketones (for example in accordance with WO 04/093207), phosphine oxides, sulfoxides and sulfones (for example in accordance with WO 05/003253), oligophenylenes, aromatic amines (for example in accordance with US 2005/0069729), bipolar matrix materials (for example in accordance with WO 07/137,725) or silanes (for example in accordance with WO 05/111172).

Preference is furthermore given to an organic electroluminescent device in which one or more layers are coated with small molecules by means of a sublimation process. Here, the materials are applied by vapour deposition in vacuum-sublimation units at a pressure below $10^{-5}$ mbar, preferably below $10^{-6}$ mbar, particularly preferably below $10^{-7}$ mbar.

Preference is likewise given to an organic electroluminescent device which is characterised in that one or more layers are coated by means of the OVPD (organic vapour phase deposition) process or with the aid of carrier-gas sublimation. Here, the materials are applied at a pressure between $10^{-5}$ mbar and 1 bar.

Preference is furthermore given to an organic electroluminescent device which is characterised in that one or more layers are produced from solution, such as, for example, by spin coating, or by means of any desired printing process, such as, for example, screen printing, flexographic printing or offset printing, but particularly preferably LITI (light induced thermal imaging, thermal transfer printing) or ink-jet printing. Soluble compounds are necessary for this purpose, which are obtained, if necessary, by suitable substitution.

The present invention is explained in greater detail below with reference to working examples, which, however, should not be regarded as restricting the scope of the present invention.

WORKING EXAMPLES

A) Preparation of the Monomers

Example 1

Phenyl 4-vinylphenyl ketone (M1)

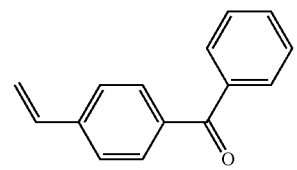 [SMILES: C=Cc1ccc(C(=O)c2ccccc2)cc1]

8.88 g of magnesium is suspended in 150 ml of dry THF in a flask which has been dried by heating, and a small amount of chlorostyrene and 2.6 ml of dichloroethane are added, and the mixture is warmed. As soon as the reaction has started, the remaining chlorostyrene (46.4 g) is added dropwise at such a rate that it boils gently. The mixture is subsequently heated under reflux for 30 minutes until the magnesium has completely dissolved. 34.2 g of benzonitrile in 60 ml of dry THF are then added dropwise over the course of 15 minutes under reflux, and the mixture is heated at the boil for a further 15 minutes.

200 ml of ice-water with 30 ml of conc. $H_2SO_4$ are initially introduced, and the batch is added with stirring, and the mixture is stirred for a further 10 minutes. The reaction mixture is subsequently transferred into a separating funnel with ethyl acetate and extended with heptane until phase separation. The phases are separated, the aqueous phase is extracted once with ethyl acetate/hexane 1/1, the organic phases are combined and washed with a saturated NaHCO₃ solution and water, dried over MgSO₄, filtered, and the solvent is stripped off in vacuo.

The residue is recrystallised from hexane (melting point: 49° C.).

62.5 g of a white solid are obtained.

Example 2

1st Step 2,4-Bisbiphenyl-3-yl-6-(3-bromophenyl)-1,3,5-triazine

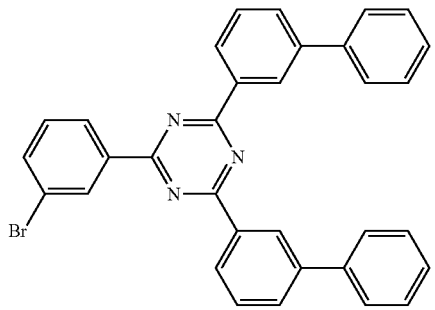 [SMILES: Brc1cccc(-c2nc(-c3cccc(-c4ccccc4)c3)nc(-c3cccc(-c4ccccc4)c3)n2)c1]

171 g of biphenyl-3-carbonitrile [24973-50-0] are slowly added at 100° C. to a suspension of 60 ml of 3-bromobenzoyl chloride [1711-09-7], 10 ml of thionyl chloride and 60.6 g of aluminium chloride in 800 ml of dichlorobenzene. The temperature increases slightly, and the reaction solution becomes an orange colour. The reaction is stirred at 115° C. until the cloudiness has disappeared. The reaction is cooled to 100° C., and aluminium chloride is added, and the mixture is stirred at 100° C. for 20 hours. The solution is cooled to room temperature and poured into 3 l of methanol, stirred for a further hour, and the resultant precipitate is filtered off with suction. The precipitate obtained is washed in hot ethanol, filtered off with suction and dried in vacuo, giving 92 g of a white solid.

2nd Step 2,4-Bisbiphenyl-3-yl-6-(4'-vinylbiphenyl-3-yl)-1,3,5-triazine (M2)

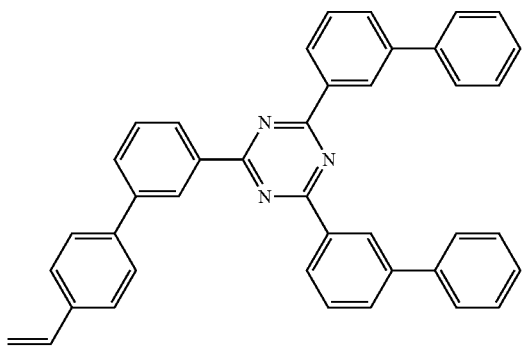 [SMILES: C=Cc1ccc(-c2cccc(-c3nc(-c4cccc(-c5ccccc5)c4)nc(-c4cccc(-c5ccccc5)c4)n3)c2)cc1]

50 g of 2,4-bisbiphenyl-3-yl-6-(3-bromophenyl)-1,3,5-triazine and 13.8 g of styreneboronic acid [2156-04-9] are dissolved in 300 ml of toluene, and 100 ml of a 2M sodium carbonate solution are added. The reaction mixture is carefully degassed, and 200 mg of tetrakistriphenylphosphinepalladium are added, and the mixture is heated under reflux for 20 hours. The solution is cooled to room temperature. The phases are separated. The aqueous phase is extracted three times with toluene, the combined organic phases are subsequently washed twice with water, dried over magnesium sulfate, filtered, and the solvent is stripped off in vacuo.

The residue is recrystallised from isopropanol.

18.8 g (36%) of a white solid having a purity of 99.7% are obtained.

Example 3

Preparation of a Comonomer

5'-p-Vinylphenyl-1,1',3',5"-terphenyl (M3)

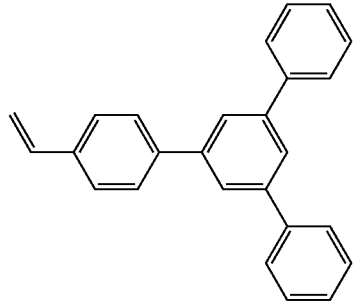 [SMILES: C=Cc1ccc(-c2cc(-c3ccccc3)cc(-c3ccccc3)c2)cc1]

35 g of 5'-bromoterphenyl [103069-20-8] and 16.7 g of styreneboronic acid [2156-04-9] are dissolved in 300 ml of toluene, and 100 ml of a 2M sodium carbonate solution are added. The reaction mixture is carefully degassed, and 200 mg of tetrakistriphenylphosphinepalladium are added, and the mixture is heated under reflux for 20 hours. The solution is cooled to room temperature. The phases are separated. The aqueous phase is extracted three times with toluene, the combined organic phases are subsequently washed twice with water, dried over magnesium sulfate, filtered, and the solvent is stripped off in vacuo.

The residue is recrystallised from isopropanol.

14 g (37%) of a white solid having a purity of 99.5% are obtained.

Example 4

[1,1';3',1"]Terphenyl-5'-yl 4'-vinylbiphenyl-3-yl ketone (M4)

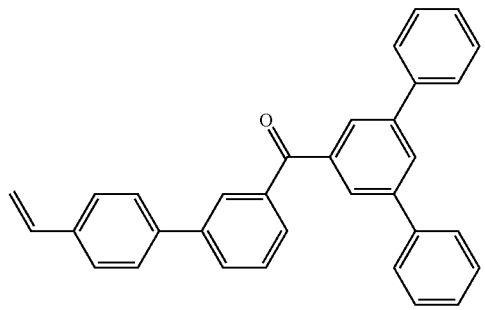 [SMILES: C=Cc1ccc(-c2cccc(C(=O)c3cc(-c4ccccc4)cc(-c4ccccc4)c3)c2)cc1]

25 g of (3-bromophenyl)-[1,1';3',1"]terphenyl-5'-ylmethanone and 8 g of styreneboronic acid [2156-04-9] are dissolved in 300 ml of toluene, and 100 ml of a 2M sodium carbonate solution are added. The reaction mixture is carefully degassed, and 200 mg of tetrakistriphenylphosphinepalladium are added, and the mixture is heated under reflux for 20 hours. The solution is cooled to room temperature. The phases are separated. The aqueous phase is extracted three times with toluene, the combined organic phases are subsequently washed twice with water, dried over magnesium sulfate, filtered, and the solvent is stripped off in vacuo.

The residue is recrystallised from heptane/acetonitrile 1:1.

12 g (45%) of a white solid having a purity of 99.9% are obtained.

Example 5

Preparation of a Comonomer

Diphenyl(4-vinylphenyl)amine (M5)

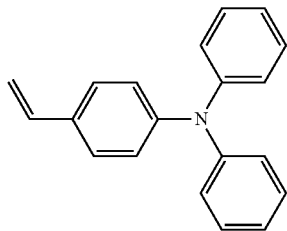 [SMILES: C=Cc1ccc(N(c2ccccc2)c2ccccc2)cc1]

19 g of methylphosphonium bromide is suspended in dried THF under protective gas, and 6 g of potassium tert-butoxide are added in portions at 0° C. An immediate colour change to orange occurs. 14 g of N,N-diphenyl-p-aminobenzaldehyde are added to the reaction solution at 0° C. The mixture is warmed to room temperature and stirred for a further 20 hours. The solvent is stripped off in vacuo, the residue is taken up in dichloromethane, and the solution is extracted with water dried over magnesium sulfate, filtered, and the solvent is stripped off in vacuo.

The yellow oil obtained is chromatographed over silica gel.

12 g (86%) of a white solid having a purity of 99.5% are obtained.

Example 6

2,4-Bisbiphenyl-3-yl-6-{3-[2-(3-ethyloxetan-3-yl-methoxy)ethyl]phenyl}-1,3,5-triazine (M6)

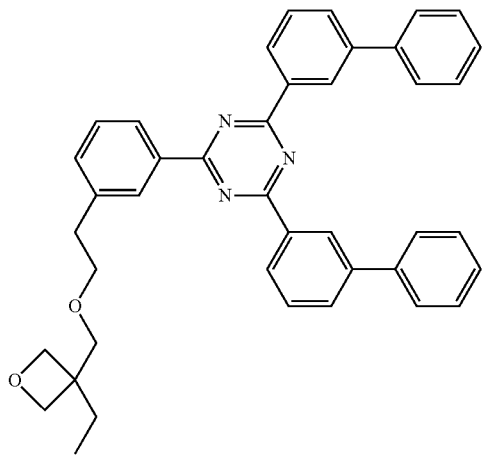 [SMILES: CCC1(COCCc2cccc(-c3nc(-c4cccc(-c5ccccc5)c4)nc(-c4cccc(-c5ccccc5)c4)n3)c2)COC1]

13.1 g of 3-ethyl-3-vinyloxymethyloxetane and 11.3 g of 9-BBN dimer (9-borabicyclo(3.3.1)nonane dimer) are dissolved in 200 ml of toluene at room temperature under protective gas and stirred for 20° C. During the reaction, the suspension of 9BBN slowly dissolves. 50 g of 2,4-bisbiphenyl-3-yl-6-(3-bromophenyl)-1,3,5-triazine and 50 ml of a 1M NaOH solution are subsequently added to the reaction solution. The reaction mixture is carefully degassed, and 200 mg of tetrakistriphenylphosphinepalladium are added, and the mixture is heated under reflux for 20 hours. The solution is cooled to room temperature. The phases are separated. The aqueous phase is extracted three times with toluene, the combined organic phases are subsequently washed twice with water, dried over magnesium sulfate, filtered, and the solvent is stripped off in vacuo.

The residue is recrystallised from ethanol/toluene 3:1.

54 g (97%) of a white solid having a purity of 99.8% are obtained.

B) Preparation and Characterisation of the Polymers

The monomers are dissolved in the composition indicated in Table 1 in 20 ml of toluene in a concentration of 1 mol/l under protective gas at 80° C. 64 mg of AIBN are subsequently added, and the mixture is stirred at 80° C. for a further 2 hours. The reaction solution is cooled to room temperature, and the polymer is obtained by precipitation in 100 ml of methanol (slowly with Pasteur pipette). The white precipitate is filtered off with suction and subsequently dissolved again in toluene and re-precipitated in methanol and filtered off with suction. The polymer is dried in a vacuum drying cabinet.

TABLE 1

Composition of polymers P1 to P11 according to the invention

| Polymer | M1 [%] | M2 [%] | M3 [%] | M4 [%] | M5 [%] | M6 [%] |
|---|---|---|---|---|---|---|
| P1 | 100 | | | | | |
| P2 | 80 | | | | 20 | |
| P3 | | | 100 | | | |
| P4 | | | 50 | 50 | | |
| P5 | | | 44 | 44 | 12 | |
| P6 | | 50 | 50 | | | |
| P7 | | 80 | | | 20 | |
| P8 | | 50 | 40 | | 10 | |
| P9 | | 60 | 25 | | 15 | |
| P10 | | 100 | | | | |
| P11 | | | | | | 100 |

The molecular weights Mn and Mw and the polydispersities D of the polymers obtained are shown in Table 2 below alongside the yields achieved. The molecular weights were determined here by means of gel permeation chromatography.

TABLE 2

Molecular weights, polydispersities and yield of polymers P1 to P11 according to the invention

| Polymer | Mw [gmol⁻¹] | Mn [gmol⁻¹] | D | Yield |
|---|---|---|---|---|
| P1 | 47,000 | 15,400 | 3.05 | 48% |
| P2 | 133,000 | 49,300 | 2.70 | 61% |
| P3 | 125,000 | 82,700 | 1.51 | 58% |
| P4 | 123,000 | 71,200 | 1.73 | 58% |
| P5 | 66,200 | 28,600 | 2.31 | 53% |
| P6 | 76,800 | 39,300 | 2.95 | 55% |
| P7 | 153,000 | 88,300 | 1.73 | 63% |

TABLE 2-continued

Molecular weights, polydispersities and yield of polymers P1 to P11 according to the invention

| Polymer | Mw [gmol⁻¹] | Mn [gmol⁻¹] | D | Yield |
|---|---|---|---|---|
| P8 | 105,200 | 62,700 | 1.68 | 55% |
| P9 | 121,500 | 68,800 | 1.77 | 64% |
| P10 | 165,200 | 87,700 | 1.88 | 47% |
| P11 | 203,400 | 123,600 | 1.64 | 43% |

C) Production of PLEDs

The production of a polymeric organic light-emitting diode (PLED) has already been described many times in the literature (for example in WO 2004/037887 A2). In order to explain the present invention by way of example, PLEDs are produced with polymers P1 to P11 from Table 2 (with different proportions of the monomers) by spin coating. In order to obtain green-emitting triplet emission, triplet emitter E1 is added to the solutions in a concentration of 20% by weight, based on the total weight of emitter and matrix.

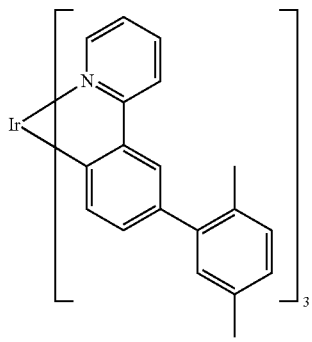

E1

A typical device has the structure depicted in FIG. 1.

To this end, use is made of substrates from Technoprint (soda-lime glass) to which the ITO structure (indium tin oxide, a transparent, conductive anode) is applied.

The substrates are cleaned with deionised water and a detergent (Deconex 15 PF) in a clean room and then activated by UV/ozone plasma treatment. An 80 nm layer of PEDOT (PEDOT is a polythiophene derivative (Baytron P VAI 4083sp.) from H. C. Starck, Goslar, which is supplied as aqueous dispersion) is then applied as buffer layer by spin coating, likewise in a clean room. The spin rate required depends on the degree of dilution and the specific spin coater geometry (typical for 80 nm: 4500 rpm). In order to remove residual water from the layer, the substrates are dried by heating at 180° C. on a hotplate for 10 minutes. Then, firstly 20 nm of an interlayer (typically a hole-dominated polymer, here HIL-012 from Merck) and then 80 nm of the polymer layers are applied from toluene solutions (concentration of interlayer 5 g/l, for polymers P1 to P11 in each case 8 g/l and thus 0.42 g/l of E1) under an inert-gas atmosphere (nitrogen or argon). The two layers are dried by heating at 180° C. for at least 10 minutes. The Ba/Al cathode is then applied by vapour deposition (high-purity metals from Aldrich, particularly barium 99.99% (Order No. 474711); vapour-deposition units from Lesker, inter alia, typical vacuum level 5×10⁻⁶ mbar). In order to protect, in particular, the cathode against air and atmospheric moisture, the device is finally encapsulated and then characterised.

Figure 2:
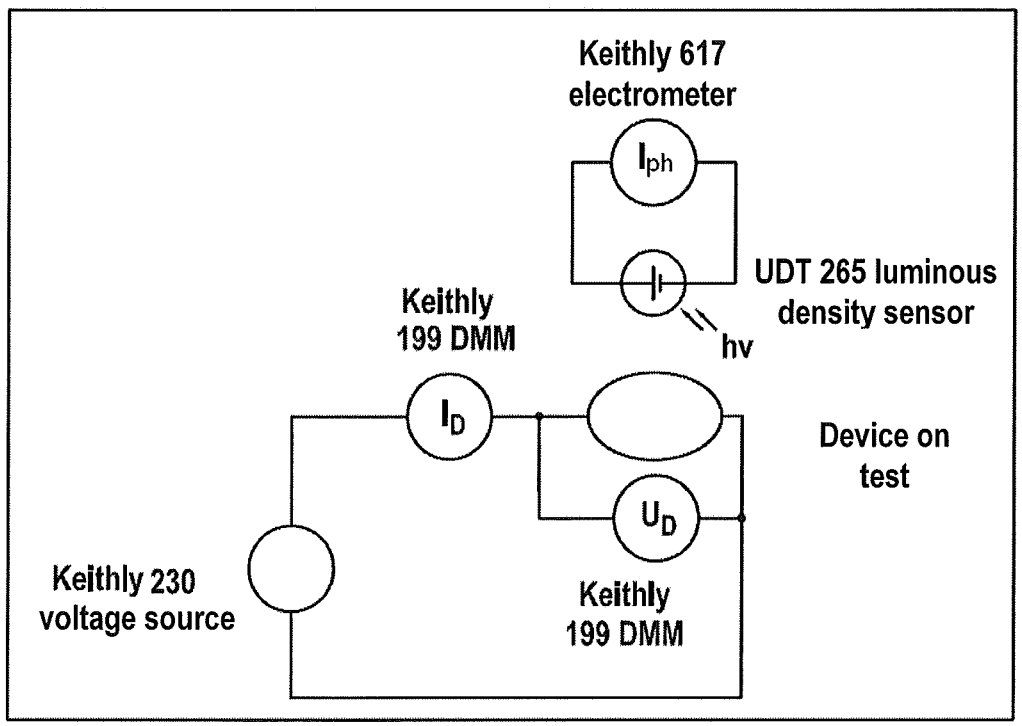
FIG. 2 is a schematic of an experimental set-up designed to measure IVL data including maximum efficiency in units of cd/A, and voltage U100 required for 100cd/m2.

To this end, the devices are clamped in holders specifically manufactured for the substrate size and provided with spring contacts. A photodiode with eye response filter can be placed directly on the measurement holder in order to exclude influences from extraneous light. A typical measurement set-up is depicted in FIG. 2.

The voltages are typically increased from 0 to max. 20 V in 0.2 V steps and reduced again. For each measurement point, the current through the device and the photocurrent obtained is measured by the photodiode. In this way, the IVL data of the test devices are obtained. Important characteristic quantities are the maximum efficiency measured ("eff." in cd/A) and the voltage U100 required for 100 cd/m².

In order, in addition, to know the colour and the precise electroluminescence spectrum of the test devices, the voltage required for 100 cd/m² is applied again after the first measurement, and the photodiode is replaced by a spectrum measuring head. This is connected to a spectrometer (Ocean Optics) by an optical fibre. The colour coordinates (CIE: Commission International de l'éclairage, 1931 standard observer) can be derived from the measured spectrum.

TABLE 3

Device results for the polymers according to the invention

| Polymer | CIE [x:y] | U [V] @ 1000 cd/m² | Eff. [cd/A] | EQE [%] |
|---|---|---|---|---|
| P1 | 0.35:0.59 | 6.2 | 16.7 | 4.5 |
| P2 | 0.35:0.59 | 4.8 | 19.2 | 5.3 |
| P3 | 0.35:0.59 | 5.8 | 31.4 | 9.6 |
| P4 | 0.35:0.59 | 5.7 | 37.2 | 12.2 |
| P5 | 0.35:0.59 | 5.5 | 39.1 | 13.6 |
| P6 | 0.35:0.59 | 5.9 | 38.7 | 12.8 |
| P7 | 0.35:0.59 | 4.5 | 42.3 | 15.9 |
| P8 | 0.35:0.59 | 4.6 | 44.1 | 16.7 |
| P9 | 0.32:0.64 | 4.6 | 43.8 | 16.4 |
| P10 | 0.35:0.59 | 4.5 | 33.3 | 9.5 |
| P11 | 0.33:0.61 | 4.5 | 38.6 | 11.0 |

The invention claimed is:

1. A polymer which comprises at least one structural unit of the following formula (I) in the side chains

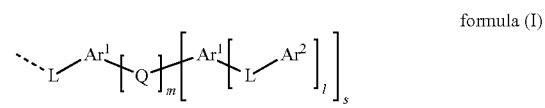

formula (I)

where the dashed line represents the connection to the polymer backbone, and the other symbols and indices used have the following meanings:

L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals R¹, where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂;

Ar¹ is on each occurrence, identically or differently, a divalent, mono- or polycyclic, aromatic or heteroaromatic ring system having 5 to 60 aromatic ring atoms, which is optionally substituted by one or more radicals R¹;

Ar² is on each occurrence, identically or differently, a mono- or polycyclic, aromatic or heteroaromatic ring system having 5 to 60 aromatic ring atoms, which is optionally substituted by one or more radicals R¹;

Q is —X(=O)— group;

m is 1, 2 or 3;

l is 0, 1, 2 or 3;

s is 1;

R¹ is on each occurrence, identically or differently, D, F, Cl, Br, I, N(Ar³)₂, CN, NO₂, Si(R²)₃, B(OR²)₂, C(=O)Ar³, P(=O)(Ar³)₂, S(=O)Ar³, S(=O)₂Ar³, —CR²=CR² (Ar³), tosylate, triflate, OSO₂R², a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or a combination of these systems; where two or more adjacent substituents R¹ may also be linked to one another via a single covalent bond or a divalent group Z;

X is selected from the group consisting of C, P(Ar⁴), S and SO;

R² is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F, or a mono- or polycyclic, aromatic or heteroaromatic ring system having 5 to 20 aromatic ring atoms, which optionally in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F; where two or more substituents R³ may also be linked to one another via a single covalent bond or a divalent group Z;

Ar³ and Ar⁴ are on each occurrence, identically or differently, a mono- or polycyclic, aromatic or heteroaromatic ring system having 5 to 60 aromatic ring atoms, which is optionally substituted by one or more radicals R³;

Z represents a divalent group —(CR⁴₂)_q—;

q is equal to 1, 2, 3, 4 or 5;

R⁴ is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F.

2. The polymer according to claim 1, wherein

L is a single covalent bond, m is 1, and

X is C or P(Ph).

3. The polymer according to claim 1, wherein Ar¹ is selected from the group consisting of phenylene, biphenylene, fluorene, carbazole, phenanthrene, dihydrophenanthrene, spirobifluorene, pyridylene, furan, naphthylene, anthracylene, pyrene, dihydropyrene, chrysene, perylene, tetracene, pentacene and benzopyrene, each of which is optionally substituted by one or more radicals R¹.

4. The polymer according to claim 1, wherein l is 1, 2 or 3, and Ar² is selected from the group consisting of phenyl, biphenyl, fluorene, carbazole, phenanthrene, dihydrophenanthrene, spirobifluorene, pyridyl, furan, naphthyl, anthracyl, pyrene, dihydropyrene, chrysene, perylene, tetracene, pentacene and benzopyrene, each of which is optionally substituted by one or more radicals R¹.

5. The polymer according to claim 1, wherein besides the side chain containing the structural unit of the formula (I), the polymer also includes at least one further side chain which contains a further structural unit.

6. The polymer according to claim 5, wherein the further structural unit is a unit of the following formula (II)

formula (II)

where the dashed line represents the connection to the polymer backbone, and

L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals R¹, where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂;

Y is a trivalent unit which is selected from the group consisting of N, B, Si(Ar⁴), SiR⁵, Ge(Ar⁴), GeR⁵, P and As;

Ar⁵ is a divalent, mono- or polycyclic, aromatic or heteroaromatic ring system having 5 to 60 aromatic ring atoms, which is optionally substituted by one or more radicals R¹;

Ar⁶ is a mono- or polycyclic, aromatic or heteroaromatic ring system having 5 to 60 aromatic ring atoms, which is optionally substituted by one or more radicals R¹;

R⁵ is on each occurrence, identically or differently, H, D, F, Cl, Br, I, N(Ar³)₂, CN, NO₂, Si(R²)₃, B(OR²)₂, C(=O) Ar³, P(=O)(Ar³)₂, S(=O)Ar³, S(=O)₂Ar³, —CR²=CR²(Ar³), tosylate, triflate, OSO₂R², a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or an aryloxy or heteroaryloxy group having 5 to 60 aromatic ring atoms, which is optionally substituted by one or more radicals R², or a combination of these systems; where two or more adjacent substituents R⁵ may also be linked to one another via a single covalent bond or a divalent group Z;

R¹ is on each occurrence, identically or differently, D, F, Cl, Br, I, $N(Ar^3)_2$, CN, $NO_2$, $Si(R^2)_3$, $B(OR^2)_2$, $C(=O)Ar^3$, $P(=O)(Ar^3)_2$, $S(=O)Ar^3$, $S(=O)_2Ar^3$, $—CR^2=CR^2(Ar^3)$, tosylate, triflate, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or a combination of these systems; where two or more adjacent substituents R¹ may also be linked to one another via a single covalent bond or a divalent group Z;

R² is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F, or a mono- or polycyclic, aromatic or heteroaromatic ring system having 5 to 20 aromatic ring atoms, which may in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F; where two or more substituents R³ may also be linked to one another via a single covalent bond or a divalent group Z;

Ar³ are on each occurrence, identically or differently, a mono- or polycyclic, aromatic or heteroaromatic ring system having 5 to 60 aromatic ring atoms, which is optionally substituted by one or more radicals R³;

Z represents a divalent group $—(CR^4{}_2)_q—$;

q is equal to 1, 2, 3, 4 or 5;

R⁴ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F.

7. The polymer according to claim 5, wherein said further structural unit is a unit of the following formula (III)

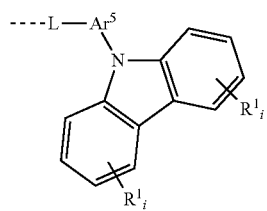

formula (III)

where the dashed line represents the connection to the polymer backbone, the non-specific bonds which end in the centre of the aromatic rings are intended to indicate that the radical R¹ may sit at each of positions 1 to 8 of the carbazole, the symbols L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals R¹, where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by F, Cl, Br, I, CN or $NO_2$;

R¹ is on each occurrence, identically or differently, D, F, Cl, Br, I, $N(Ar^3)_2$, CN, $NO_2$, $Si(R^2)_3$, $B(OR^2)_2$, $C(=O)Ar^3$, $P(=O)(Ar^3)_2$, $S(=O)Ar^3$, $S(=O)_2Ar^3$, $—CR^2=CR^2(Ar^3)$, tosylate, triflate, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or a combination of these systems; where two or more adjacent substituents R¹ may also be linked to one another via a single covalent bond or a divalent group Z;

R² is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F, or a mono- or polycyclic, aromatic or heteroaromatic ring system having 5 to 20 aromatic ring atoms, which may in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F; where two or more substituents R³ may also be linked to one another via a single covalent bond or a divalent group Z;

Ar³ are on each occurrence, identically or differently, a mono- or polycyclic, aromatic or heteroaromatic ring system having 5 to 60 aromatic ring atoms, which is optionally substituted by one or more radicals R³;

Z represents a divalent group $—(CR^4{}_2)_q—$;

q is equal to 1, 2, 3, 4 or 5;

R⁴ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F;

Ar⁵ is a divalent, mono- or polycyclic, aromatic or heteroaromatic ring system having 5 to 60 aromatic ring atoms, which is optionally substituted by one or more radicals R¹; and the index i is equal to 0, 1, 2, 3 or 4.

8. The polymer according to claim 5, wherein said further structural unit is a unit of the following formula (IV)

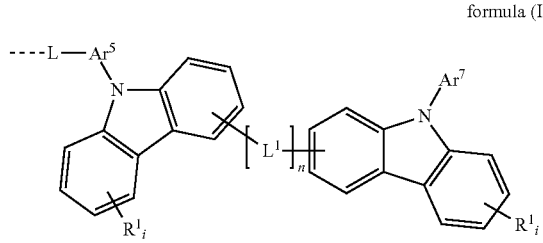

formula (IV)

where the dashed line represents the connection to the polymer backbone,
the non-specific bonds which end in the centre of the aromatic rings are intended to indicate that the symbols $R^1$ and $L^1$ may each sit at each of the corresponding positions 1 to 8 of the carbazole,
wherein
L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals $R^1$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$;
$R^1$ is on each occurrence, identically or differently, D, F, Cl, Br, I, $N(Ar^3)_2$, CN, $NO_2$, $Si(R^2)_3$, $B(OR^2)_2$, $C(=O)Ar^3$, $P(=O)(Ar^3)_2$, $S(=O)Ar^3$, $S(=O)_2Ar^3$, $-CR^2=CR^2(Ar^3)$, tosylate, triflate, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$, or a combination of these systems; where two or more adjacent substituents $R^1$ may also be linked to one another via a single covalent bond or a divalent group Z;
$R^2$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F, or a mono- or polycyclic, aromatic or heteroaromatic ring system having 5 to 20 aromatic ring atoms, which may in each case be substituted by one or more radicals $R^3$; where two or more substituents $R^2$ may also be linked to one another via a single covalent bond or a divalent group Z;
$R^3$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F; where two or more substituents $R^3$ may also be linked to one another via a single covalent bond or a divalent group Z;
$Ar^3$ are on each occurrence, identically or differently, a mono- or polycyclic, aromatic or heteroaromatic ring system having 5 to 60 aromatic ring atoms, which is optionally substituted by one or more radicals $R^3$;
Z represents a divalent group $-(CR^4_2)_q-$;
q is equal to 1, 2, 3, 4 or 5;
$R^4$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F;
$Ar^5$ is a divalent, mono- or polycyclic, aromatic or heteroaromatic ring system having 5 to 60 aromatic ring atoms, which is optionally substituted by one or more radicals $R^1$;
the index i is equal to 0, 1, 2, 3 or 4;
$L^1$ is on each occurrence, identically or differently, a single covalent bond or a straight-chain alkylene group having 1 to 20 C atoms or a branched or cyclic alkylene group having 3 to 20 C atoms, each of which is optionally substituted by one or more radicals $R^1$, where one or more non-adjacent $CH_2$ groups is optionally replaced by $R^2C=CR^2$, $C\equiv C$, $Si(R^2)_2$, $Ge(R^2)_2$, $Sn(R^2)_2$, $C=O$, $C=S$, $C=Se$, $C=NR^2$, $P(=O)(R^2)$, SO, $SO_2$, $NR^2$, O, S or $CONR^2$ and where one or more H atoms is optionally replaced by F, Cl, Br, I, CN or $NO_2$;
n is equal to 0, 1, 2 or 3, with the proviso that, if n>1, a maximum of one $L^1$ is optionally an aromatic or heteroaromatic ring system;
$Ar^7$ is a mono- or polycyclic, aromatic or heteroaromatic ring system having 5 to 60 aromatic ring atoms, which is optionally substituted by one or more radicals $R^1$.

9. The polymer according to claim 5, wherein said further structural unit is a unit of the following formula (V)

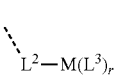

formula (V)

where the dashed line represents the connection to the polymer backbone, and the symbols and indices used have the following meanings:
$L^2$ and $L^3$ are, independently of one another, on each occurrence, identically or differently, a mono- or polydentate ligand;
M is a transition metal, a main-group metal, a lanthanoid or an actinoid;
r is equal to 0, 1, 2, 3, 4, 5, 6 or 7, depending on the denticity of the ligands $L^2$ and $L^3$ and the coordination number of the metal M.

10. The polymer according to claim 5, wherein said further structural unit is a unit of the following formula (VII)

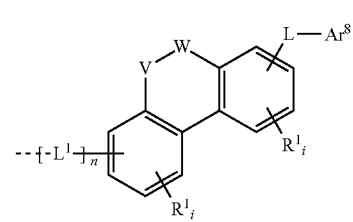

formula (VII)

where the dashed line represents the connection to the polymer backbone the non-specific bonds which end in the centre of the aromatic rings are intended to indicate that the symbols $R^1$, L and $L^1$ may each sit at each of the free positions of the aromatic rings, the symbols $R^1$, L and $L^1$ and the indices i and n have the same meanings as in the preceding claims, and the other symbols used have the following meanings:

V and W are selected, independently of one another, from the group consisting of $C(Ar^3)_2$, $C(R^5)_2$, $Si(Ar^3)_2$, $Si(R^5)_2$, $Ge(Ar^3)_2$, $Ge(R^5)_2$, C=O, O, S, Se, $N(Ar^4)$, $N(R^5)$, $P(Ar^4)$, $P(R^5)$, $P=O(Ar^3)$, $P=O(R^5)$, B and $(R^5)_2CO$;

$R^5$ is on each occurrence, identically or differently, H, D, F, Cl, Br, I, $N(Ar^3)_2$, CN, $NO_2$, $Si(R^2)_3$, $B(OR^2)_2$, C(=O)$Ar^3$, $P(=O)(Ar^3)_2$, $S(=O)Ar^3$, $S(=O)_2Ar^3$, $-CR^2=CR^2(Ar^3)$, tosylate, triflate, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, C=$NR^2$, $P(=O)(R^2)$, SO, $SO_2$, $NR^2$, O, S or $CONR^2$ and where one or more H atoms is optionally replaced by F, Cl, Br, I, CN or $NO_2$, or an aryloxy or heteroaryloxy group having 5 to 60 aromatic ring atoms, which is optionally substituted by one or more radicals $R^2$, or a combination of these systems; where two or more adjacent substituents $R^5$ may also be linked to one another via a single covalent bond or a divalent group Z $Ar^8$ is a mono- or polycyclic, aromatic or heteroaromatic ring system having 5 to 60 aromatic ring atoms, which is optionally substituted by one or more radicals $R^1$;

L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals $R^1$, where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, C=$NR^2$, $P(=O)(R^2)$, SO, $SO_2$, $NR^2$, O, S or $CONR^2$ and where one or more H atoms is optionally replaced by F, Cl, Br, I, CN or $NO_2$;

$R^1$ is on each occurrence, identically or differently, D, F, Cl, Br, I, $N(Ar^3)_2$, CN, $NO_2$, $Si(R^2)_3$, $B(OR^2)_2$, $C(=O)Ar^3$, $P(=O)(Ar^3)_2$, $S(=O)Ar^3$, $S(=O)_2Ar^3$, $-CR^2=CR^2(Ar^3)$, tosylate, triflate, $OSO_2R^2$, a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals $R^2$, where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, C=$NR^2$, $P(=O)(R^2)$, SO, $SO_2$, $NR^2$, O, S or $CONR^2$ and where one or more H atoms is optionally replaced by F, Cl, Br, I, CN or $NO_2$, or a combination of these systems; where two or more adjacent substituents $R^1$ may also be linked to one another via a single covalent bond or a divalent group Z;

$R^2$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F, or a mono- or polycyclic, aromatic or heteroaromatic ring system having 5 to 20 aromatic ring atoms, which may in each case be substituted by one or more radicals $R^3$; where two or more substituents $R^2$ may also be linked to one another via a single covalent bond or a divalent group Z;

$R^3$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F; where two or more substituents $R^3$ may also be linked to one another via a single covalent bond or a divalent group Z;

$Ar^3$ and $Ar^4$ are on each occurrence, identically or differently, a mono- or polycyclic, aromatic or heteroaromatic ring system having 5 to 60 aromatic ring atoms, which is optionally substituted by one or more radicals $R^3$;

the index i is equal to 0, 1, 2, 3 or 4;

Z represents a divalent group $-(CR^4{}_2)_q-$;

q is equal to 1, 2, 3, 4 or 5;

$R^4$ is on each occurrence, identically or differently, a straight-chain alkyl group having 1 to 20 C atoms or a branched or cyclic alkyl group having 3 to 20 C atoms, where one or more non-adjacent $CH_2$ groups is optionally replaced by NH, O or S and where one or more H atoms is optionally replaced by F.

11. A mixture comprising one or more polymer(s) according to claim 1 with further polymeric, oligomeric, dendritic or low-molecular-weight substances.

12. A formulation comprising the mixture according to claim 10 in one or more solvents.

13. A compound of the following formula (Ia)

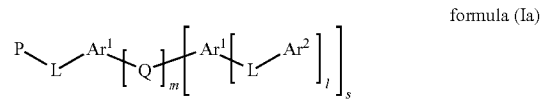

formula (Ia)

wherein

L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals $R^1$, where one or more non-adjacent $CH_2$ groups is optionally replaced by $R^2C=CR^2$, C≡C, $Si(R^2)_2$, $Ge(R^2)_2$, $Sn(R^2)_2$, C=O, C=S, C=Se, C=$NR^2$, $P(=O)(R^2)$, SO, $SO_2$, $NR^2$, O, S or $CONR^2$ and where one or more H atoms is optionally replaced by F, Cl, Br, I, CN or $NO_2$;

$Ar^1$ is on each occurrence, identically or differently, a divalent, mono- or polycyclic, aromatic or heteroaromatic ring system having 5 to 60 aromatic ring atoms, which is optionally substituted by one or more radicals $R^1$;

$Ar^2$ is on each occurrence, identically or differently, a mono- or polycyclic, aromatic or heteroaromatic ring system having 5 to 60 aromatic ring atoms, which is optionally substituted by one or more radicals $R^1$;

Q is $-X(=O)-$ group;

m is 1, 2 or 3;

l is 0, 1, 2 or 3;

s is 1;

$R^1$ is on each occurrence, identically or differently, D, F, Cl, Br, I, $N(Ar^3)_2$, CN, $NO_2$, $Si(R^2)_3$, $B(OR^2)_2$, $C(O)Ar^3$, $P(=O)(Ar^3)_2$, $S(=O)Ar^3$, $S(=O)_2Ar^3$, $-CR^2=CR^2$ (Ar³), tosylate, triflate, OSO₂R², a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or a combination of these systems; where two or more adjacent substituents R¹ may also be linked to one another via a single covalent bond or a divalent group Z;

X is selected from the group consisting of C, P(Ar⁴), S and SO;

R² is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F, or a mono- or polycyclic, aromatic or heteroaromatic ring system having 5 to 20 aromatic ring atoms, which optionally in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F; where two or more substituents R³ may also be linked to one another via a single covalent bond or a divalent group Z;

Ar³ and Ar⁴ are on each occurrence, identically or differently, a mono- or polycyclic, aromatic or heteroaromatic ring system having 5 to 60 aromatic ring atoms, which is optionally substituted by one or more radicals R³;

Z represents a divalent group —(CR⁴₂)_q—;

q is equal to 1, 2, 3, 4 or 5;

R⁴ is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F and the symbol P is a polymerisable group.

14. A composition which comprises the compound according to claim 12.

15. An electronic device which comprises the polymer according to claim 1.

16. An electronic device which comprises the compound according to claim 13.

17. An electronic device which comprises the composition according to claim 14.

18. The electronic device as claimed in claim 15, wherein the device is an organic electroluminescent device.

19. An organic electronic device which comprises the polymer according to claim 1.

20. The organic electronic device according to claim 15, wherein the device is an organic or polymeric organic electroluminescent device, an organic integrated circuit, an organic field-effect transistor, an organic thin-film transistor, an organic solar cell, an organic laser diode, an organic photovoltaic element or device or organic photoreceptor.

21. The compound according to claim 13, wherein

L is a single covalent bond, m is 1, and

X is C or P(Ph).

22. A polymer which comprises at least one structural side chain unit of the following formula

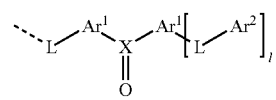

where the dashed line represents the connection to the polymer backbone, and the other symbols and indices used have the following meanings:

L is on each occurrence, identically or differently, a single covalent bond or a straight-chain alkylene group having 1 to 20 C atoms or a branched or cyclic alkylene group having 3 to 20 C atoms, each of which is optionally substituted by one or more radicals R¹, where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂;

Ar¹ is on each occurrence, identically or differently, a divalent, mono- or polycyclic, aromatic or heteroaromatic ring system having 5 to 60 aromatic ring atoms, which is optionally substituted by one or more radicals R¹;

Ar² is on each occurrence, identically or differently, a mono- or polycyclic, aromatic or heteroaromatic ring system having 5 to 60 aromatic ring atoms, which is optionally substituted by one or more radicals R¹;

l is 0, 1, 2 or 3;

R¹ is on each occurrence, identically or differently, D, F, Cl, Br, I, N(Ar³)₂, CN, NO₂, Si(R²)₃, B(OR²)₂, C(=O)Ar³, P(=O)(Ar³)₂, S(=O)Ar³, S(=O)₂Ar³, —CR²=CR² (Ar³), tosylate, triflate, OSO₂R², a straight-chain alkyl, alkoxy or thioalkoxy group having 1 to 40 C atoms or a branched or cyclic alkyl, alkoxy or thioalkoxy group having 3 to 40 C atoms, each of which is optionally substituted by one or more radicals R², where one or more non-adjacent CH₂ groups is optionally replaced by R²C=CR², C≡C, Si(R²)₂, Ge(R²)₂, Sn(R²)₂, C=O, C=S, C=Se, C=NR², P(=O)(R²), SO, SO₂, NR², O, S or CONR² and where one or more H atoms is optionally replaced by F, Cl, Br, I, CN or NO₂, or a combination of these systems; where two or more adjacent substituents R¹ may also be linked to one another via a single covalent bond or a divalent group Z;

X is C or P(Ph);

R² is on each occurrence, identically or differently, a straight-chain alkyl group having 1 to 20 C atoms or a branched or cyclic alkyl group having 3 to 20 C atoms, where one or more non-adjacent CH₂ groups is optionally replaced by NH, O or S and where one or more H atoms is optionally replaced by F, or a mono- or polycyclic, aromatic or heteroaromatic ring system having 5 to 20 aromatic ring atoms, which optionally in each case be substituted by one or more radicals R³; where two or more substituents R² may also be linked to one another via a single covalent bond or a divalent group Z;

R³ is on each occurrence, identically or differently, a straight-chain alkyl group having 1 to 20 C atoms or a branched or cyclic alkyl group having 3 to 20 C atoms, where one or more non-adjacent CH$_2$ groups is optionally replaced by NH, O or S and where one or more H atoms is optionally replaced by F; where two or more substituents R³ may also be linked to one another via a single covalent bond or a divalent group Z;

Ar³ and Ar⁴ are on each occurrence, identically or differently, a mono- or polycyclic, aromatic or heteroaromatic ring system having 5 to 60 aromatic ring atoms, which is optionally substituted by one or more radicals R³;

Z represents a divalent group —(CR⁴$_2$)$_q$—;

q is equal to 1, 2, 3, 4 or 5;

R⁴ is on each occurrence, identically or differently, a straight-chain alkyl group having 1 to 20 C atoms or a branched or cyclic alkyl group having 3 to 20 C atoms, where one or more non-adjacent CH$_2$ groups is optionally replaced by NH, O or S and where one or more H atoms is optionally replaced by F; and the polymer further comprises a structural unit of formula (III)

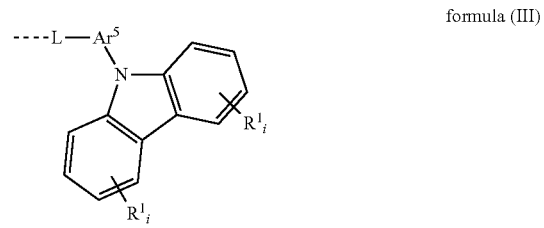

formula (III)

where the dashed line represents the connection to the polymer backbone, the non-specific bonds which end in the centre of the aromatic rings are intended to indicate that the radical R¹ may sit at each of positions 1 to 8 of the carbazole, and the symbols L, R¹, and Ar⁵ is a divalent, mono- or polycyclic, aromatic or heteroaromatic ring system having 5 to 60 aromatic ring atoms, which is optionally substituted by one or more radicals R¹; and the index i is equal to 0, 1, 2, 3 or 4.

* * * * *